(12) United States Patent
Chou

(10) Patent No.: US 11,061,519 B2
(45) Date of Patent: Jul. 13, 2021

(54) PSEUDO-PIEZOELECTRIC D33 VIBRATION DEVICE AND DISPLAY INTEGRATING THE SAME

(71) Applicant: May Sun Technology Co., Ltd., Hsinchu (TW)

(72) Inventor: Bruce C. S. Chou, Hsin Chu (TW)

(73) Assignee: MAY SUN TECHNOLOGY CO., LTD., Hsinchu (TW)

( * ) Notice: Subject to any disclaimer, the term of this patent is extended or adjusted under 35 U.S.C. 154(b) by 0 days.

(21) Appl. No.: 16/859,169

(22) Filed: Apr. 27, 2020

(65) Prior Publication Data

US 2020/0348796 A1 Nov. 5, 2020

(30) Foreign Application Priority Data

May 3, 2019 (TW) .................................. 108115346
Aug. 12, 2019 (TW) .................................. 108128509
Jan. 22, 2020 (TW) .................................. 109102411

(51) Int. Cl.
*G06F 3/044* (2006.01)
*G06F 1/16* (2006.01)
(Continued)

(52) U.S. Cl.
CPC .......... *G06F 3/0445* (2019.05); *G06F 1/1652* (2013.01); *G06K 9/0002* (2013.01);
(Continued)

(58) Field of Classification Search
CPC ................. G06F 1/1652; G06F 3/0445; G06F 2203/04102; G06F 2203/04111;
(Continued)

(56) References Cited

U.S. PATENT DOCUMENTS 9,093,355 B2 * 7/2015 Wang ....................... H01L 29/84
9,312,468 B2 * 4/2016 Sohn .................... H01L 41/0478
(Continued)

FOREIGN PATENT DOCUMENTS

CN 105182583 A 12/2015
JP 2006211185 A 8/2006
(Continued)

OTHER PUBLICATIONS

Office Action and Search Report issued in corresponding TW application No. 109113752 dated Dec. 4, 2020.
(Continued)

*Primary Examiner* — Vinh T Lam
(74) *Attorney, Agent, or Firm* — Muncy, Geissler, Olds and Lowe, P.C.

(57) ABSTRACT

A pseudo-piezoelectric d33 vibration device includes transistors and receivers electrically connected to the transistors. Each transistor controls a corresponding one of the receivers to receive a second vibration wave, generated after an object reflects a first vibration wave, and to generate a sensing signal. Each receiver has a first electrode, a second electrode and a nano-gap, which is created between the first and second electrodes after a semiconductor-metal compound is formed. A display integrating the pseudo-piezoelectric d33 vibration device is also provided.

42 Claims, 21 Drawing Sheets

(51) Int. Cl.
*G06K 9/00* (2006.01)
*H01L 41/047* (2006.01)
*H01L 41/113* (2006.01)

(52) U.S. Cl.
CPC ...... *H01L 41/0471* (2013.01); *H01L 41/1132* (2013.01); *G06F 2203/04102* (2013.01); *G06F 2203/04111* (2013.01)

(58) Field of Classification Search
CPC ............ G06K 9/00885; G06K 9/0002; G06K 2009/00932; B06B 1/0622; H01L 41/0471; H01L 41/1132
See application file for complete search history.

(56) References Cited

U.S. PATENT DOCUMENTS

| | | | |
|---|---|---|---|
| 9,455,399 B2* | 9/2016 | Wang | H01L 41/187 |
| 10,067,229 B2* | 9/2018 | Djordjev | G06K 9/0002 |
| 10,802,630 B2* | 10/2020 | Guo | H01L 27/3225 |
| 2002/0011777 A1 | 1/2002 | Konishi et al. | |
| 2006/0179640 A1 | 8/2006 | Machida et al. | |
| 2008/0067618 A1* | 3/2008 | Wang | H01L 29/0676 |
| | | | 257/415 |
| 2008/0269614 A1 | 10/2008 | Adachi et al. | |
| 2008/0283751 A1* | 11/2008 | Kymissis | G01J 5/34 |
| | | | 250/338.3 |
| 2013/0021304 A1* | 1/2013 | Zuo | H03H 9/173 |
| | | | 345/204 |
| 2013/0021305 A1* | 1/2013 | Zuo | H03H 3/02 |
| | | | 345/204 |
| 2013/0050166 A1 | 2/2013 | Hong et al. | |
| 2013/0076209 A1* | 3/2013 | Zuo | H03H 9/02062 |
| | | | 310/366 |
| 2015/0165479 A1 | 6/2015 | Lasiter et al. | |
| 2015/0169136 A1 | 6/2015 | Ganti et al. | |
| 2017/0251290 A1 | 8/2017 | Yang et al. | |
| 2018/0046836 A1* | 2/2018 | Hinger | G06K 9/0002 |
| 2018/0310916 A1 | 11/2018 | Loebl et al. | |
| 2018/0367098 A1* | 12/2018 | Colli | H03B 5/364 |
| 2019/0095015 A1* | 3/2019 | Han | G06F 3/0412 |

FOREIGN PATENT DOCUMENTS

| | | |
|---|---|---|
| JP | 2007097760 A | 4/2007 |
| JP | 2013034665 A | 2/2013 |
| JP | 2014531744 A | 11/2014 |
| JP | 2017503255 A | 1/2017 |
| TW | 201621585 A | 6/2016 |
| TW | 201734605 A | 10/2017 |
| TW | 201828006 A | 8/2018 |
| TW | 201838429 A | 10/2018 |

OTHER PUBLICATIONS

Japanese Office Action dated Apr. 2, 2021 in corresponding JP Patent Application No. 2020-076380 with English translation, pages.

* cited by examiner

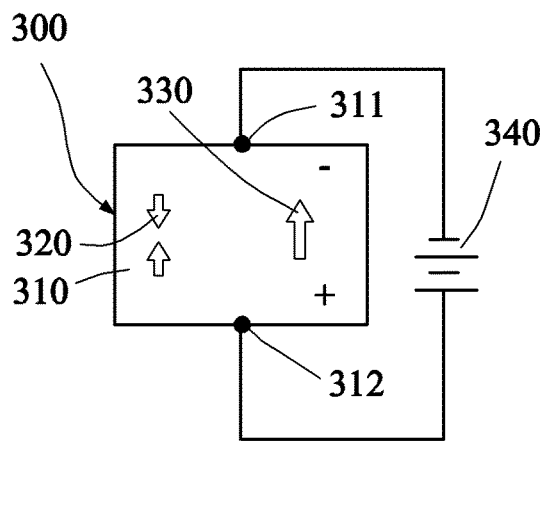 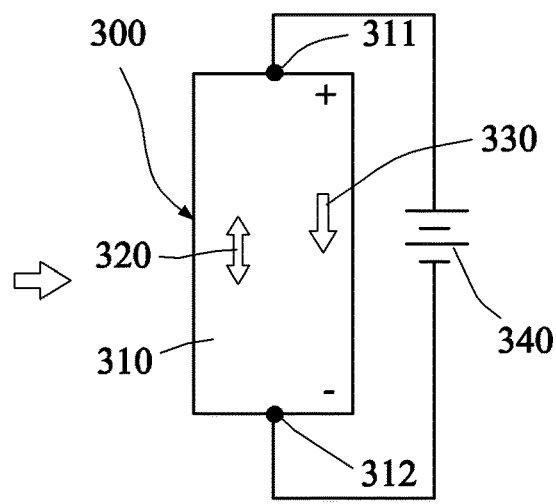
FIG. 1A (Prior Art)    FIG. 1B (Prior Art)
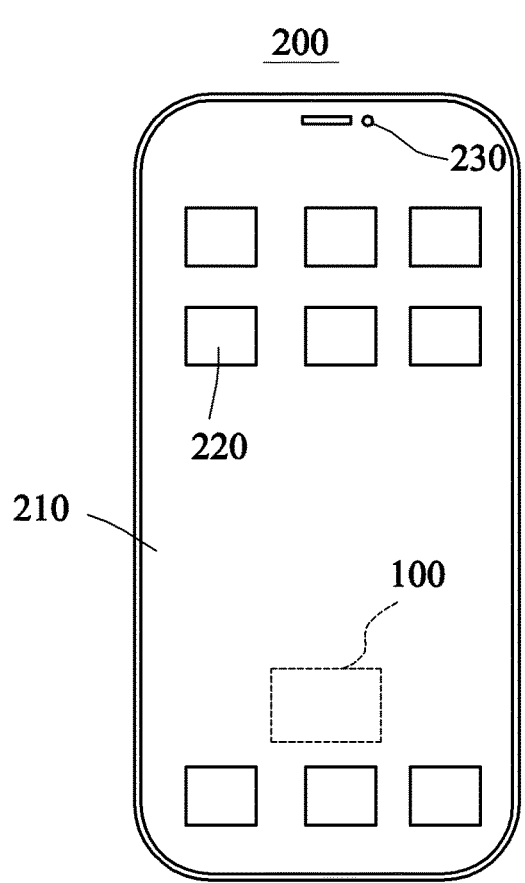 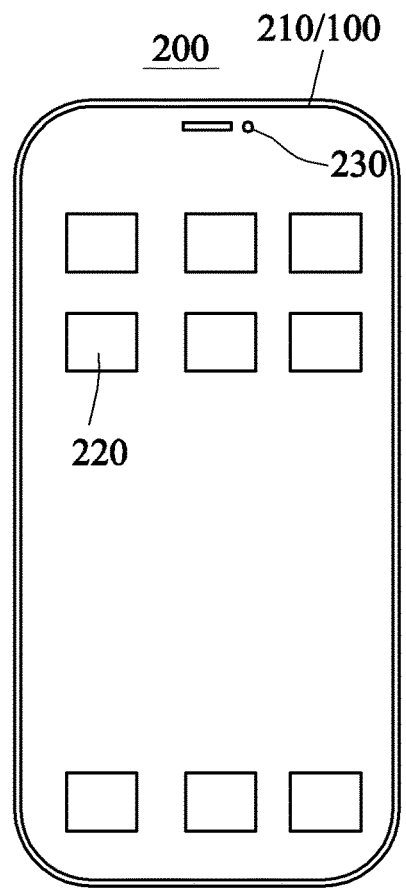
FIG. 2A    FIG. 2B

PSEUDO-PIEZOELECTRIC D33 VIBRATION DEVICE AND DISPLAY INTEGRATING THE SAME

CROSS-REFERENCE TO RELATED APPLICATIONS

This application claims priorities of Nos. 108115346; 108128509; and 109102411 respectively filed in Taiwan R.O.C. on May 3, 2019; Aug. 12, 2019; and Jan. 22, 2020 under 35 USC 119, the entire contents of which are hereby incorporated by reference.

BACKGROUND OF THE INVENTION

Field of the Invention

This disclosure relates to a pseudo-piezoelectric d33 vibration device and a display integral the same, and more particularly to a pseudo-piezoelectric d33 vibration device, which has an integrated transceiver and is applicable to various electronic devices, apparatuses and systems, and relates to a display integrating the transceiver.

Description of the Related Art

A conventional vibration-type transceiver, sensor or transducer, such as sonic or ultrasonic transceiver, can be used for measurement of medical organ images, gesture detection, three-dimensional touch, fingerprint sensing, subcutaneous bioinformation (capillary information, blood flow information) measurement and the like through a medium, such as air or fluid or through direct or indirect contact with the object. The conventional technology is usually implemented by a piezoelectric material, such as polyvinylidene difluoride (PVDF), lead zirconate titanate (PZT) or the like. The operation mode thereof is to use the material's d33 mode. That is, the electric field direction applied to the material is parallel to the vibration direction of the material.

FIGS. 1A and 1B show schematic views of a conventional d33 vibration-type transceiver. Referring to FIGS. 1A and 1B, a conventional d33 vibration-type transceiver 300 includes a piezoelectric block (piezoelectric material block) 310 having top and bottom ends applied with a voltage source 340 to generate an electric field to deform the piezoelectric material. When the electric field continuously changes, the piezoelectric block 310 vibrates in a vibration direction 320. When the electric field direction 330 created by the piezoelectric block 310 is parallel to the vibration direction 320, the operation is in the d33 mode. For example, in FIG. 1A, the voltage source 340 applies negative and positive voltages to first and second electrodes 311 and 312, respectively, to cause the upward electric field direction 330 and contraction of the piezoelectric block 310. In FIG. 1B, the voltage source 340 applies positive and negative voltages to the first and second electrodes 311 and 312, respectively, to cause the downward electric field direction 330 and elongation of the piezoelectric block 310. When the alternate electric fields are applied to FIGS. 1A and 1B, the retractable vibration of the piezoelectric block 310 can be generated.

Upon manufacturing, PVDF is engineering plastic, processes of exposure, development and the like cannot be easily performed by adopting semiconductor manufacturing process, such as lithography and the like, and the processing usually only can rely on laser processing, for example. Therefore, it is very problematic to integrate the PVDF with the semiconductor manufacturing process. PZT is contaminating and cannot be micro-machined easily, and the d33 operation mode cannot be implemented until the bulk or block material is used (e.g., the thin film PZT is operated in the d31 mode). Such PZT is usually produced by way of sintering at the high temperature ranging from 700 to 800° C., or even 1000° C. Therefore, the conventional d33 PZT elements are discrete elements, and integration with the semiconductor manufacturing process becomes very difficult or even impossible so that the piezoelectricity element cannot be integrated with the integrated circuit. Also, the lead contaminates the semiconductor device. Furthermore, PZT needs the platinum electrodes, so that the manufacturing cost is high.

Furthermore, upon operation of the conventional piezoelectric material, the applied voltage usually ranges from tens to hundreds of volts. Such high voltage encounters a problem upon system integration, and a big problem upon integration with the semiconductor manufacturing process.

BRIEF SUMMARY OF THE INVENTION

An objective of this disclosure is to provide a pseudo-piezoelectric d33 vibration device with the advantages of easy integration with the semiconductor manufacturing process, easy processing and low cast but without contamination.

To achieve the above-identified objective, this disclosure provides a pseudo-piezoelectric d33 vibration device includes transistors and receivers electrically connected to the transistors. Each transistor controls a corresponding one of the receivers to receive a second vibration wave, generated after an object reflects a first vibration wave, and to generate a sensing signal. Each receiver has a first electrode, a second electrode and a nano-gap, which is created between the first and second electrodes after a semiconductor-metal compound is formed.

This disclosure also provides a display including transistors, receivers and display units. The receivers are electrically connected to the transistors. Each transistor controls a corresponding one of the receivers to receive a second vibration wave, generated after an object reflects a first vibration wave, and to generate a sensing signal. Each receiver has a first electrode, a second electrode and a nano-gap, which is created between the first and second electrodes after a semiconductor-metal compound is formed. Each display unit includes at least one display control transistor and a display pixel electrically connected together. The display control transistor controls enabling of the display pixel to display an optical signal and disabling of the display pixel not to display the optical signal so that data is displayed.

With the above-mentioned aspects of this disclosure, a pseudo-piezoelectric d33 structure functioning as a vibration-type transceiver and having functions the same as the piezoelectric vibration element can be provided without utilization of the piezoelectric material. More particularly, integration with the semiconductor manufacturing process and the integrated circuit element becomes possible without temperature limitations and contamination problems. Meanwhile, only the standard voltage, such as 3.3 volts or 5 volts, is needed upon operation, thereby significantly increasing system integration simplicity.

In order to make the above-mentioned content of this disclosure more comprehensible, the preferred embodiments are described below in detail in conjunction with the accompanying drawings.

BRIEF DESCRIPTION OF THE SEVERAL VIEWS OF THE DRAWINGS

FIGS. 1A and 1B show schematic views of a conventional d33 vibration-type transceiver.

FIGS. 2A, 2B and 3 show schematic views of three applications of a pseudo-piezoelectric d33 vibration device according to a preferred embodiment of this disclosure.

DETAILED DESCRIPTION OF THE INVENTION

The pseudo-piezoelectric d33 vibration device provided in the embodiment of this disclosure is not made of the piezoelectric material, but uses a vibration structure having a vacuum-gap-containing or air-gap-containing membrane structure to achieve the transceiving function of making the applied electric field direction be the same as the vibration direction. The term "d33" is usually based on the piezoelectric material. In this disclosure, the conventional piezoelectric material is replaced with a micro-structure, so the vibration-type transceiver of this disclosure is named as the pseudo-piezoelectric d33 vibration device to simulate behaviors of the bulk piezoelectric material.

Figure 3:
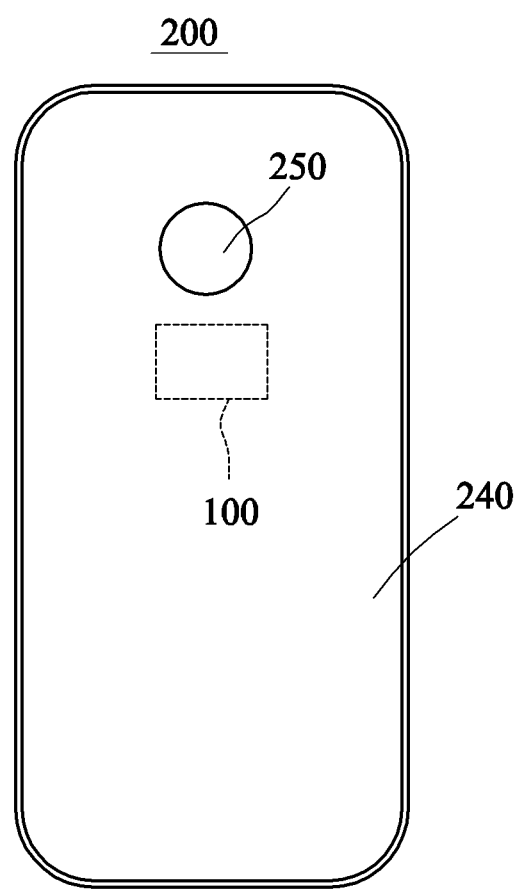

FIGS. 2A, 2B and 3 show schematic views of three applications of a pseudo-piezoelectric d33 vibration device 100 according to a preferred embodiment of this disclosure. However, the system application of the device of this disclosure is not restricted thereto. In FIG. 2A, the vibration device 100 may be integrally mounted in a display 210 on the front side (display side) of a mobile phone 200 or assembled under the display 210 (e.g., directly or indirectly assembled with the bottom surface of the display 210), the top surface of the display 210 displays operation icons 220 to be clicked by the user, and a front lens 230 is disposed beside the display 210. Of course, the mobile phone system is only an example. Those skilled in the art should know that, with the evolution over time and applications, mobile phones may have various modifications. Due to the manufacturing features, the device of this disclosure can be integrated in the mobile phone display or disposed under the display, and may also occupy a partial area (the dashed-line area in FIG. 2A), or cover the entire area (in FIG. 2B, the device 100 covers the entire area of the display 210). Of course, if the mobile phone display is entirely covered, then the device can even have various integrated functions combining some functions, such as biometrics characteristic sensing (e.g., fingerprint, finger vein, blood flow rate, heartbeat and the like), 3D touch, gesture detection and the like, to provide the all-in-one integrated functions. Such features are not present in the prior art, and are also important characteristics of the device of this disclosure. In FIG. 3, the vibration device 100 may also be mounted under a back cover 240 on the backside of the mobile phone 200, onto which a rear lens 250 is also mounted. The vibration device 100 can provide functions of sensing, for example but without limitation to, fingerprint, vein patterns or blood information and the like, and any physical features that can be sensed using vibration waves can be implemented thereby. Of course, the device of this disclosure also needs not to be integrated with the mobile phone, display or module, can be individually designed into an independent vibration-wave-system device, and can be used to replace the market available piezoelectric d33 vibration element (for organs scanning). For example, using the mobile phone and cloud system (may be combined with artificial intelligence) to link with the independent device of this disclosure can function as the portable vibration-wave detection system used in medical, industry image applications or the like. The fingerprint sensor applied to the mobile phone is provided as one example of this disclosure for explanation, so that those skilled in the art understand features and innovation of this disclosure.

In the embodiment of this disclosure, a voltage drives two electrodes to generate the electric field, wherein one electrode is the membrane structure, the other electrode is mounted on a substrate, and a vacuum or air gap is formed between the two electrodes. When the applied electric field is an alternating-current (AC) signal, the membrane vibrates, and if the frequency of the alternating-current signal and the mechanical resonance frequency of the membrane structure are the same, then the membrane generates mechanical resonance to amplify the mechanical energy and amplitude in the preferred embodiment. Of course, the device of this disclosure may also change the structural rigidity through the electrostatic attraction or even pull-in contact of the membrane structure, and thus change the resonance frequency. In another embodiment, the structure can be operated in a non-resonant mode. In this manner, this device may be a variable frequency transceiver for sensing depth information of different characteristics of the object, and this is advantageous to the construction of the integral 3D image. For example, the finger's biometrics information can be measured by varying the frequency, or even the finger texture, the vein pattern or blood information inside the finger and the like can be measured at the same time.

Figure 4:
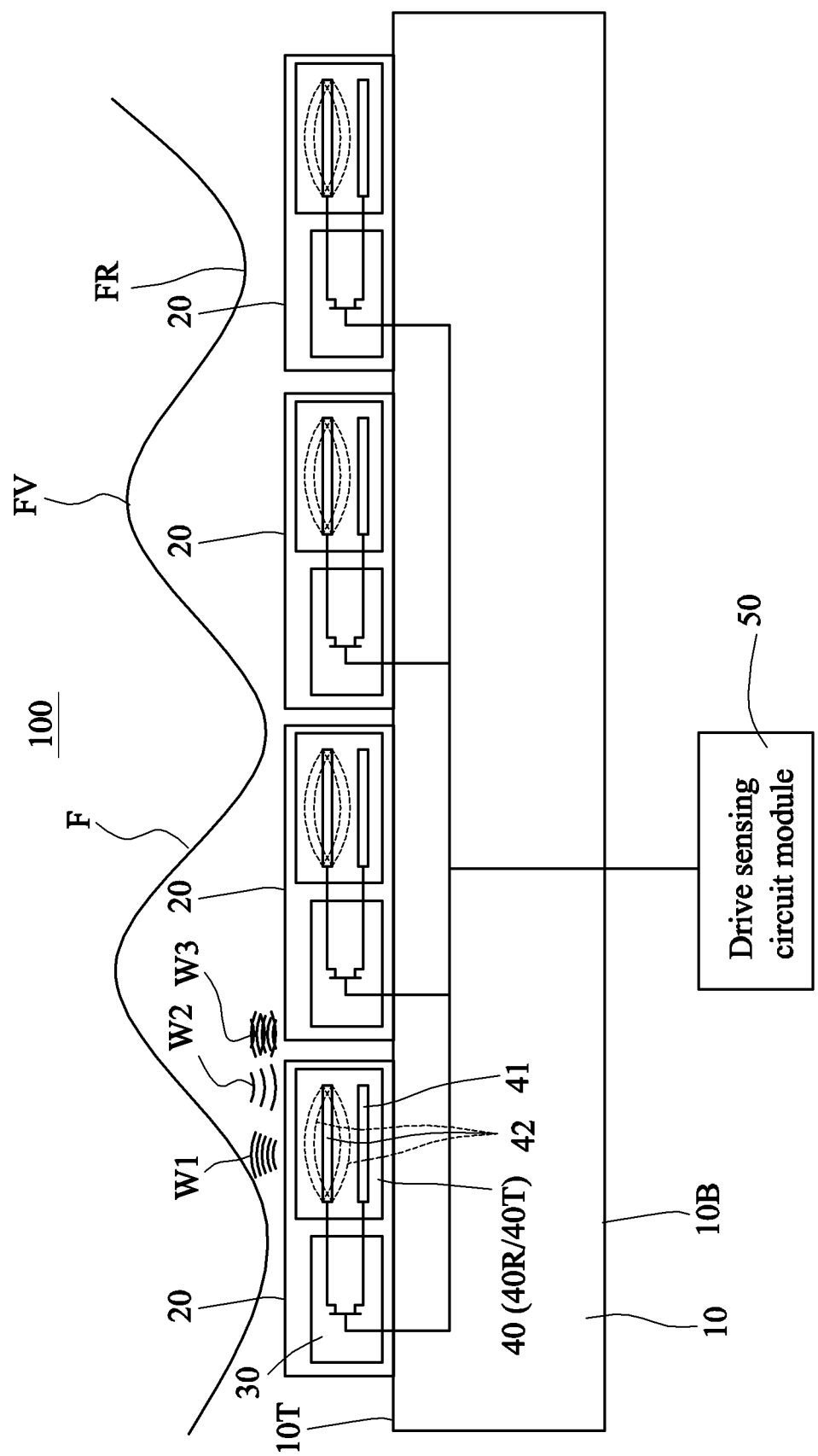
FIG. 4 is a schematic view showing the pseudo-piezoelectric d33 vibration device according to the preferred embodiment of this disclosure.
Figure 5:
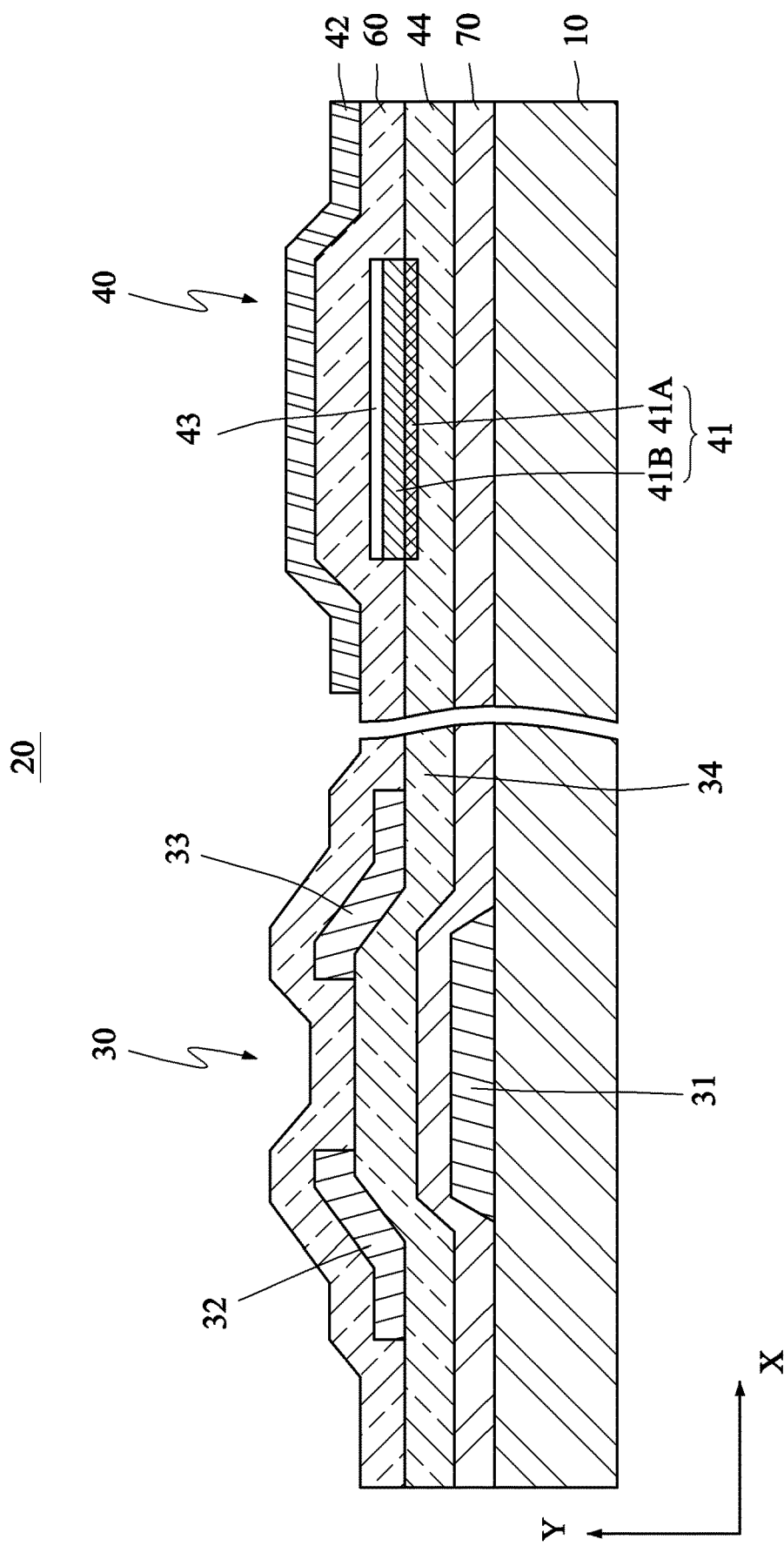
FIG. 5 is a partial cross-sectional view showing one example of the pseudo-piezoelectric d33 vibration device of FIG. 4.

FIG. 4 is a schematic view showing the pseudo-piezoelectric d33 vibration device 100 according to the preferred embodiment of this disclosure. FIG. 5 is a partial cross-sectional view showing one example of the pseudo-piezoelectric d33 vibration device of FIG. 4. Referring to FIGS. 4 and 5, the vibration device 100 of this embodiment includes transistors 30 and receivers 40R electrically connected to the transistors 30. Although a side-by-side arrangement is illustrated in the drawings, a not-shown stacking scheme (e.g., the receivers 40R are stacked above the transistors 30) may also be implemented. Each transistor 30 controls a corresponding one of the receivers 40R to receive a second vibration wave W2 generated after an object F reflects a first vibration wave W1, and to generate a sensing signal. Each receiver 40R has a first electrode 41, a second electrode 42 and a nano-gap 43, which is created between the first and second electrodes 41 and 42 after a semiconductor-metal compound is formed. In this embodiment, each receiver 40R may further function as a transmitter 40T to operate as a transceiver unit 40. The transceiver unit 40 and the corresponding transistor 30 constitute an integrated transceiver 20. In the integrated transceiver 20, the transceiver unit 40 neighbors upon the transistor 30, and the transistor 30 controls the transceiver unit 40 to transmit the first vibration wave W1 at a first time instant, and then controls the transceiver unit 40 to receive the second vibration wave W2 at a second time instant.

The vibration device 100 may further include a substrate 10 and a drive sensing circuit module 50. The substrate 10 has an upper surface 10T and a bottom surface 10B. Each integrated transceiver 20 is disposed on the upper surface 10T of the substrate 10. It is worth noting that one single integrated transceiver 20 may also achieve the function of this disclosure, and the drive sensing circuit module 50 may be a built-in or external circuit device.

The substrate 10 may be, for example but without limitation to, a glass substrate, a flexible substrate (e.g., polyimide (PI) substrate), any insulation substrate, a semiconductor substrate formed with an insulating layer or the like.

FIG. 5 shows an embodiment of this disclosure using the thin-film transistor (TFT) manufacturing process. As mentioned hereinabove, the device of this disclosure applied to a mobile phone system is explained, and the main human-machine interface of the mobile phone is the display. So, the device of this disclosure is manufactured using the TFT manufacturing process of the mobile phone display and therefore, or may be integrated into one single panel formed by the organic light-emitting diode (OLED) manufacturing process, for example. Alternatively, the OLED manufacturing process is omitted, and only the TFT manufacturing process is kept to complete the device. Of course, this disclosure is not restricted to the OLED display, and the LCD, future micro-LED (uLED) technology and the like may be applicable to this disclosure; or the device can be by way of assembling disposed under the display, back cover or lateral side of the mobile phone. This is one of the most important spirits of this disclosure. The integrated transceivers 20 are arranged in an array along the X-axis direction of FIG. 5, and disposed on the substrate 10. Each integrated transceiver 20 includes at least one transistor 30 (may be one or multiple transistors formed on the glass substrate or other substrates) and at least a transceiver unit 40. In this embodiment, the transistor 30 is a TFT to be explained as an example, but this disclosure is not restricted thereto. The transceiver unit 40 is disposed on one side (horizontal side) of the transistor 30, and first and second semiconductor layers 34 and 44 pertain to the same polysilicon layer or amorphous silicon layer. In another embodiment, the transceiver unit 40 may be stacked on the vertical side of the transistor 30 (above or below the transistor 30, for example, two polysilicon layers or amorphous silicon layers), so that the space in the horizontal direction needs not to be scarified. The transistor 30 disposed on the substrate 10 has a gate 31, a drain 32, a source 33 and a first semiconductor layer 34 disposed among the gate 31, the drain 32 and the source 33. The gate 31 is formed on the substrate 10.

The transceiver unit 40 neighbors upon the transistor 30, and is directly or indirectly electrically connected to the transistor 30, which controls transmitting and receiving (active and passive functions) of the transceiver unit 40 to enable the transceiver unit 40 (drive the membrane electrode) to transmit a first vibration wave W1 to an object F, which may be the organism or non-organism and reflects the first vibration wave W1 to generate a second vibration wave W2. The transceiver unit 40 receives the second vibration wave W2 by vibrating the membrane electrode to generate a sensing signal. The distances from the ridge FR and valley FV of the object F, such as the finger, to the vibration device 100 are different from each other, so different corresponding sensing signals are generated. The meaning associated with "the transceiver unit 40 neighboring upon the transistor 30" may cover that the transceiver unit 40 is disposed on the left, right, top, bottom, top left, bottom left, top right and bottom right sides of the transistor 30. In one example, spaces covered by the transistor 30 and the transceiver unit 40 do not overlap with each other.

In this embodiment, referring to FIGS. 5 and 4, the vibration device 100 powers the first and second electrodes 41 and 42 to apply a varying electric field to generate the vertically vibrating first vibration wave W1, and the first vibration wave W1 transferring upward encounters one or multiple interfaces of the finger F approaching the device 100, and is reflected by the interface of the finger F to generate the second vibration wave W2. The device 100 senses the property of the second vibration wave W2 or senses the interference wave W3 caused by the second and first vibration waves W2 and W1 to generate the sensing signal. In one example, the second vibration wave W2 transfers downward to interfere with the sense capacitance change between the second and first electrodes 42 and 41 to generate the sensing signal. In another example, the second vibration wave W2 transfers downward to interfere with the downward-transferring first vibration wave W1 to generate the interference wave W3. The second and first electrodes 42 and 41 measure the interference wave W3 according to the sense capacitance change to generate the sensing signal. Therefore, using the design of an array device 100 can measure the distance information between the device 100 and the ridge FR and valley FV of the finger F, and thus generate the fingerprint image (the skin is the interface). The frequency of the first vibration wave W1 may also be adjusted concurrently or in different time intervals, and the first vibration wave W1 may penetrate through the skin, so that the vein's distribution image (the vein wall is the interface) can be measured according to different vibration waves reflected by the vein. In one example, the interference wave W3 is generated by the constructive interference between the second and first vibration waves W2 and W1 to obtain the larger amplitude. In another example, the interference wave W3 is generated by the destructive interference between the second and first vibration waves W2 and W1 to obtain the smaller amplitude. In still another example, the device 100 can be designed to generate the constructive interference with the second and first vibration waves W2 and W1, created after the ridge FR of the finger F reflects the waves, and to generate the destructive interference with the second and first vibration waves W2 and W1, created after the valley FV of the finger F reflects the waves, so that the discrimination rate of the ridge and valley can be increased. Another transmitting-sensing mode is the time of flight (TOF) mode, wherein the transmitting and sensing timings are switched, and the travelling distance of the vibration wave is determined according to the sensing time difference, so that the 3D image of the object F is constructed. Because the forward wave encounters different interfaces to have different reflecting timings, different interfaces of images (e.g., fingerprint and vein images) can be stacked concurrently. Meanwhile, different frequencies of waves can be transmitted to achieve the objective of sensing different interfaces. In this embodiment, the frequency of the vibration wave may range from 20 KHz to 200 MHz, and the optimum frequency thereof may range from 2 MHz to 40 MHz. In another sensing mode, it is possible to concurrently control several transceiver units, and control phase differences between the first vibration waves of the transceiver units, energies of the first vibration waves are concentrated and sequentially scanned by way of beam forming, to maximize the energy of the first vibration wave W1 (the energy of the reflected second vibration wave W2 is thus increased), so that the sensitivity can be increased.

For simplicity, FIG. 4 only describes the basic operation principle and practical application of the vibration device of this disclosure in the system embodiment of FIG. 2/3, for example, and another display structure is provided between the device and object (e.g., finger). That is, W1/W2 needs to transfer between different materials in the display to complete the transceiving function. Those skilled in the art should understand this content, so detailed display structures will not be described in this disclosure.

The transceiver unit 40 has the first electrode 41, the second electrode 42, the nano-gap 43 disposed between the first and second electrodes 41 and 42, and a second semiconductor layer 44 disposed between the substrate 10 and the first electrode 41. In this embodiment, the first and second semiconductor layers 34 and 44 pertain to a same layer of material. When the TFT is used, the first and second semiconductor layers 34 and 44 have the same material, or are even formed using the same manufacturing process. However, this disclosure is not restricted thereto, and in FIG. 9 to be explained hereinbelow, for example, the first and second semiconductor layers 34 and 44 may be formed by different materials (e.g., the first semiconductor layer is made of monocrystalline silicon, polysilicon or amorphous silicon, the second semiconductor layer 44 is made of polysilicon or amorphous silicon, and the layers 34 and 44 may be made of the same or different layers of materials). A height of the nano-gap 43 (in the Y-axis direction of FIG. 5) is smaller than or equal to 200 nanometers (nm), 100 nm or even 50 nm. Under the same drive voltage, the electric field intensity is inversely proportional to the square of the distance, and the gap is very small, so even the very low voltage can generate the stronger electric field to drive the electrodes, and this is another spirit of this disclosure. Therefore, the drive sensing circuit module 50 electrically connected to each integrated transceiver 20 can provide a drive voltage ranging from 3.3 to 12 volts to each integrated transceiver 20 without the conventional drive voltage ranging from tens to hundreds of volts. Thus, the designs of the system and the sensing drive integrated circuit (IC) become relatively simple. The electrical connection can be achieved by the conventional conductor connection, and detailed descriptions thereof will be omitted.

If such a small nano-gap needs to be implemented conventionally, the sacrificial layer is usually adopted. For example, the sacrificial layer and the protection layer on the sacrificial layer are firstly formed, then openings are formed on the protection layer, and then the sacrificial layer is etched and removed through the openings. However, the gap is very small, so the sacrificial layer cannot be easily removed (due to the capillary phenomenon). Alternatively, after the sacrificial layer is removed, the membrane structure is stuck to the bottom electrode, so the nano-scale sacrificial layer structure is inefficient and cannot be easily manufactured. In addition, these openings finally need to be filled up, and the filling material tends to fall into the openings to form the post structures pushing against the membrane, and the vibration function of the membrane is disabled. Therefore, the prior art cannot be easily achieved. In the current trend, the larger area of the finger biometrics sensor is preferred to satisfy the user's blind press (just press to complete the desired function), or more than two fingerprints can be pressed concurrently to enhance the security. However, if the silicon IC manufacturing process is adopted, then the cost will be high. If the conventional piezoelectric block is used and integrated with or applied to TFT liquid crystal display (TFT-LCD), then the implementation is very difficult due to the reason mentioned hereinabove because the piezoelectric material needs the very-high temperature sintering. So, this disclosure has the very simple structure and material, the material is not contaminating, the manufacturing temperature is also relatively low (<300° C.), and can be integrated with any TFT manufacturing process, silicon integrated circuit manufacturing process (e.g., CMOS manufacturing process) or the like, which is not mentioned in the conventional examples.

In this embodiment, the first electrode 41 includes a semiconductor-metal compound (a metal silicide layer 41A) and a metal layer 41B (optional, because it may become the metal silicide layer 41A after total reaction). The metal silicide layer 41A is buried into the second semiconductor layer 44, and the metal layer 41B is disposed on the metal silicide layer 41A. In one example, the metal layer 41B (e.g., nickel layer) and the second semiconductor layer 44 (e.g., amorphous silicon or polysilicon layer) encounter the thermal reaction (<300° C.), and can partially or entirely react to form the metal silicide layer 41A through the volume reduction upon formation of the metal silicide and the material's selectively. In the preferred embodiment of this disclosure, for example, nickel and silicon are paired. The nickel and a protection layer 60 (e.g., silicon oxide or nitride) cannot react at the temperature within 300° C. So, the nickel (metal layer 41B) reacts in the direction toward the second semiconductor layer 44 and the volume of nickel (metal layer 41B) is decreased. Thus, the nano-gap between nickel (metal layer 41B) and the protection layer 60 is formed and is gradually increased. Controlling the material thickness and reaction temperature and time can make nickel (metal layer 41B) react completely or partially. Therefore, the nano-gap 43 of this embodiment is formed after the semiconductor-metal compound is formed. In other words, the nano-gap 43 directly neighbors upon the metal layer 41B thereunder, while the metal layer 41B directly neighbors upon the metal silicide layer 41A (because other semiconductor materials may be adopted, semiconductor-metal compounds may be present in other embodiments). Alternatively, when the metal layer 41B entirely reacts with the second semiconductor layer 44 to form the semiconductor-metal compound, the nano-gap 43 directly neighbors upon the semiconductor-metal compound thereunder. Therefore, the nano-gap 43 neighbors upon the semiconductor-metal compound through the metal layer 41B of the first electrode 41, or directly neighbors upon the semiconductor-metal compound. The gap under the protection layer can be accurately controlled within the predetermined nanometer range. For example, the nickel film manufactured by the semiconductor physical vapor deposition (PVD) may have the thickness equal to 100 nm or 50 nm, the formed gaps have the same order of magnitude. Such the method can really achieve the advantages mentioned hereinbefore, and can only utilize the low operation voltage (<12V) to obtain the strong electric field to drive the pseudo-piezoelectric d33 vibration device.

Therefore, the vibration device 100 further includes the protection layer 60 and an insulating layer 70. The protection layer 60 covers the drain 32, the source 33, and the first and second semiconductor layers 34 and 44. The nano-gap 43 is surrounded and formed by the protection layer 60 and the first electrode 41, and the second electrode 42 is disposed on the protection layer 60. The insulating layer 70 covers the gate 31 and the substrate 10, and supports the first and second semiconductor layers 34 and 44. Heretofore, those skilled in the art can understand that the device of this disclosure only adds a silicide metal manufacturing process (the metal is preferred Ni but without limitation) through the temperature and material compatible with the TFT manufacturing process to manufacture the pseudo-piezoelectric d33 vibration device. The great advantages of the integration, cost and performance are obtained. Of course, only portions of the TFT manufacturing process and structure are explained, wherein other back-end indium tin oxide (ITO) electrodes, the OLED or LCD material or other display material and structure manufacturing and the like do not pertain to the objective of this disclosure, and will be omitted. However, any manufacturing process adjustment or material change, pertaining to either the existing technology or future novel technology, will not change or affect the spirit of this disclosure.

In one example, the first electrodes 41 of the transceiver units 40 are directly or indirectly electrically connected together through the second and first semiconductor layers 44 and 34 to function as an integrated common electrode. In another example, multiple second electrodes 42 may also be electrically connected together to function as a common electrode.

Figure 6A:
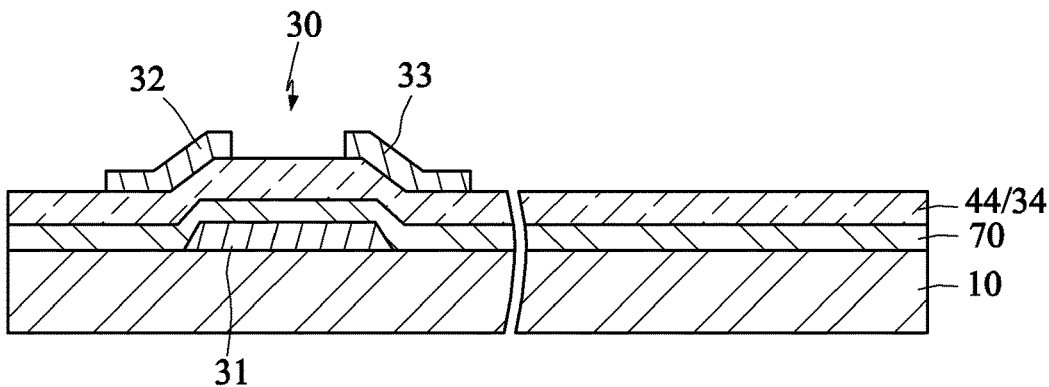
FIGS. 6A to 6G show schematically cross-sectional views of structures in steps of the manufacturing method of the pseudo-piezoelectric d33 vibration device of FIG. 5.

FIGS. 6A to 6G show schematically cross-sectional views of structures in steps of the manufacturing method of the pseudo-piezoelectric d33 vibration device of FIG. 5. In FIG. 6A, a portion of the transistor 30 is firstly formed on the left side of the substrate 10, the partial material, such as the insulating layer 70 (oxide, nitride, a stack thereof or any other material) and the second and first semiconductor layers 44 and 34, needed for the formation of the transistor 30, is reserved on the right side. At this time, the second and first semiconductor layers 44 and 34 pertain to the same layer, such as amorphous silicon or polysilicon layer, which is an important material layer of the transistor 30.

Figure 6B:
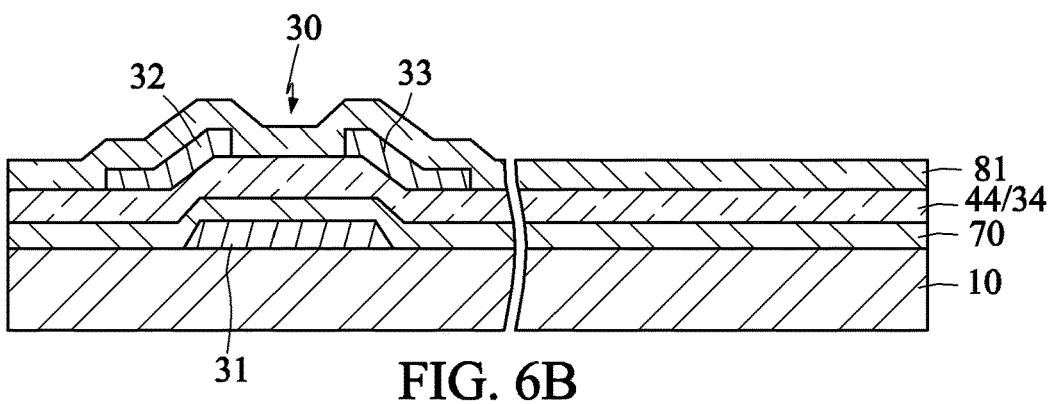
Figure 6C:
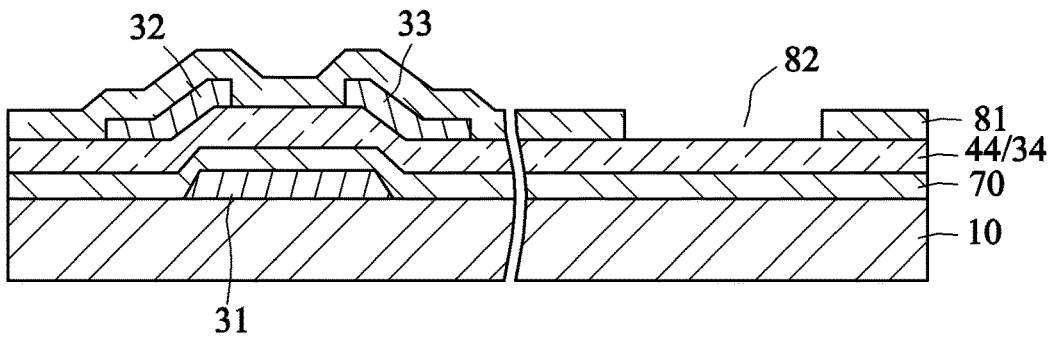
Figure 6D:
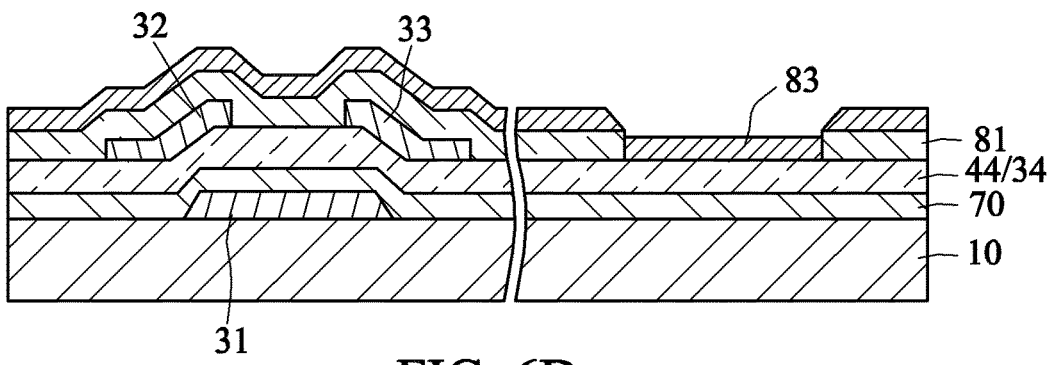
Figure 6E:
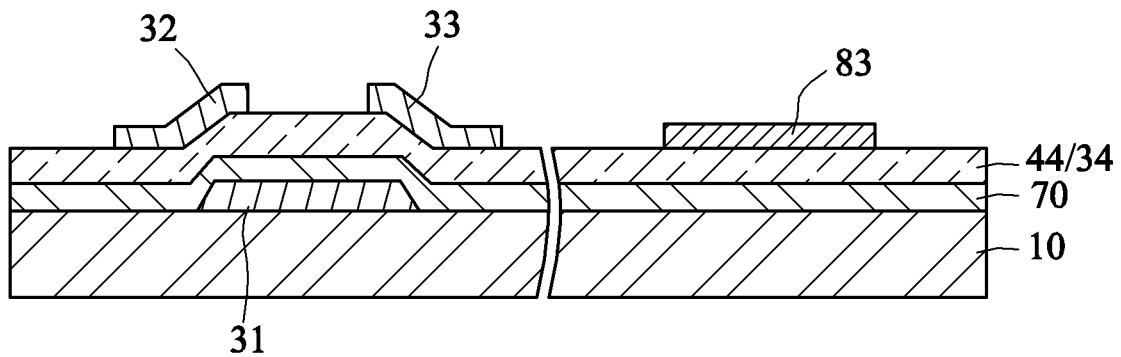
Figure 6F:
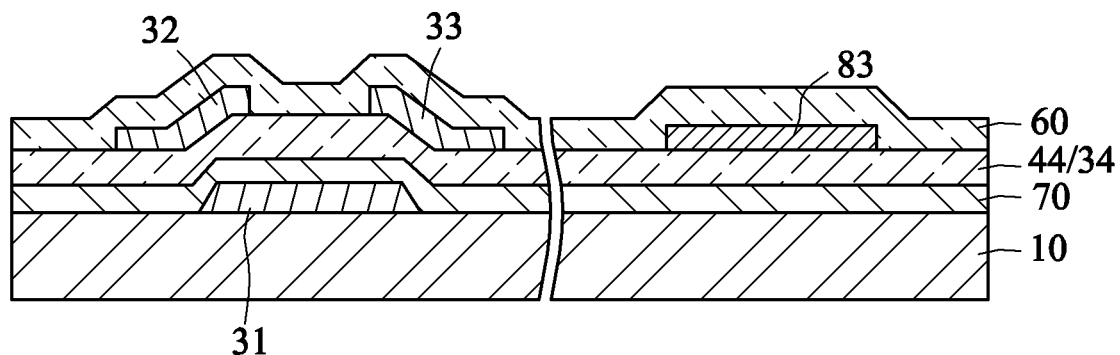
Figure 6G:
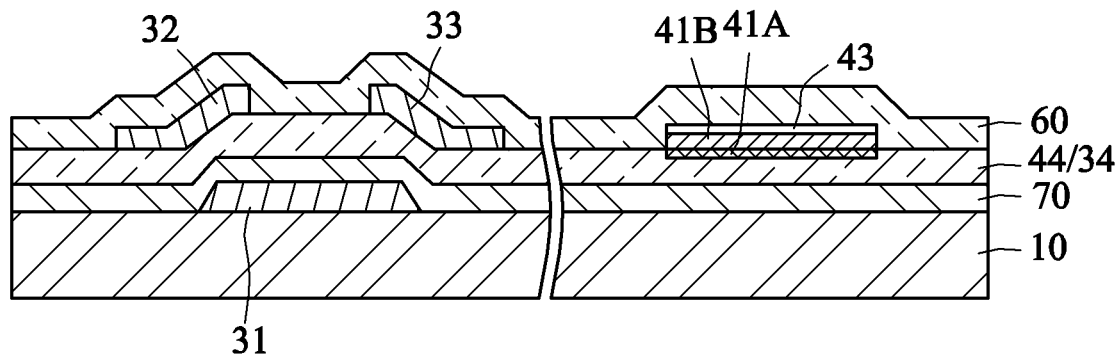

Next, in FIG. 6B, a resist layer 81 covers the second semiconductor layer 44, the drain 32 and the source 33. Next, in FIG. 6C, the resist layer 81 is patterned to form an opening 82. Then, in FIG. 6D, a metal layer 83, made of a material such as nickel, is formed on the top surface of the overall structure of FIG. 6C. The metal layer 83 is filled into the opening 82 and also covers the resist layer 81. Next, in FIG. 6E, the resist layer 81 is removed, and a portion of the metal layer 83 is reserved. In this embodiment, a portion of the metal layer 83 is formed by way of lift-off. However, this disclosure is not restricted thereto, and a portion of the metal layer 83 may also be formed by etching, lithography or the like. Then, in FIG. 6F, the protection layer 60 is formed on the second semiconductor layer 44, the drain 32, the source 33 and the metal layer 83. Next, in FIG. 6G, the overall structure of FIG. 6F is moved to the oven at the temperature of about or above 250° C., so that the metal layer 83 and the second semiconductor layer 44 thermally react to generate the metal silicide layer 41A. Meanwhile, a portion of the metal layer 83 is reserved as the metal layer 41B. The thickness of the metal layer 83 can be controlled to be 100 nm, for example, to control the height of the nano-gap 43. The nano-gap 43 is a vacuum or approximate vacuum hermetic chamber formed by one or multiple thermal reactions between the metal material and semiconductor material. Because the chemically thermal reaction forms the metal silicide layer 41A, the volume of the metal layer 83 is decreased to form the nano-gap 43 having the height that can be controlled to be quite small, such as several tens of nanometers. So, the electric field generated when the drive voltage ranging from 3.3 to 12 volts is applied to the first and second electrodes 41 and 42 is equivalent to the electric field generated when the drive voltage ranging from several tens to hundreds of volts is applied to the conventional structure. The second electrode 42 driven by the electric field vertically vibrates to output the vibration wave, and then receives the vibration wave reflected from the object. Then, in FIG. 5, the second electrode 42, made of the material, such as ITO conductor, aluminum or the like, is formed on the protection layer 60, so that the integration with the display becomes possible. It is worth noting that the second electrode 42 may be firstly formed on the structure of FIG. 6F, and then the thermal chemical reaction is conducted without affecting the effect of this embodiment. That is, deciding the forming sequence of the metal silicide according to the manufacturing process requirement is flexible without affecting the result of this disclosure.

In this example, the manufacturing processes compatible with the amorphous silicon TFT at the temperature lower than 350° C. (the temperature of growing the amorphous silicon may reach 350° C., and the temperature of the subsequent manufacturing process ranges from about 100 to 200° C.), and compatible with the low-temperature polysilicon (LTPS) TFT at the temperature ranging from 500 to 600° C. may be adopted. Using the amorphous silicon or polysilicon present in the TFT as a reserved layer to thermally and chemically react the metal layer to form the nano-gap can achieve the effect of this disclosure. Of course, the manufacturing method and structure of this disclosure may also be integrated with the back-end CMOS manufacturing process, for example.

Figure 7:
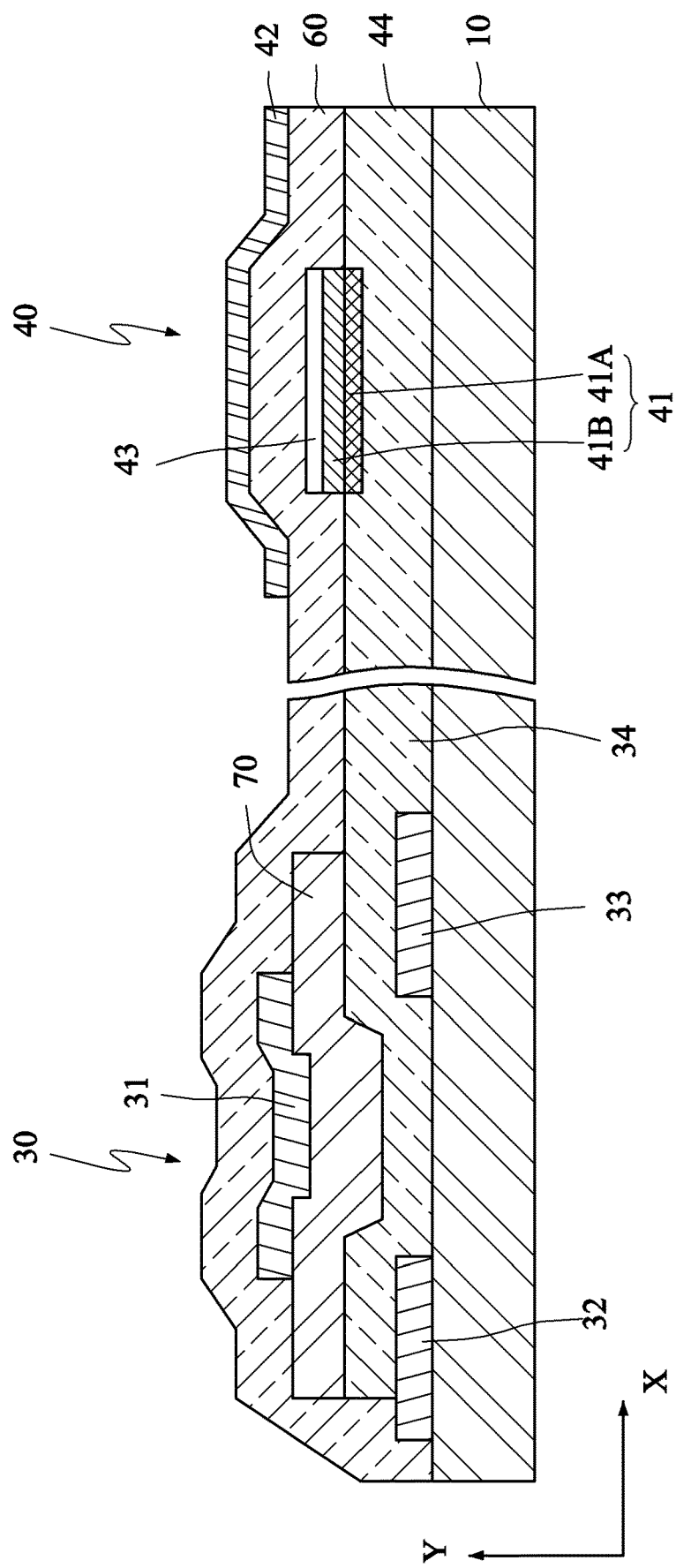
FIG. 7 is a partial cross-sectional view showing another example of the pseudo-piezoelectric d33 vibration device of FIG. 4.

FIG. 7 is a partial cross-sectional view showing another example of the pseudo-piezoelectric d33 vibration device of FIG. 4. In FIG. 7, this example is similar to FIG. 5 except for that FIG. 5 pertains to a bottom-gate TFT, while FIG. 7 pertains to a top-gate TFT, which is also implementable, so the drain 32 and source 33 are formed on the substrate 10. In FIG. 7, the protection layer 60 of the vibration device 100 covers the gate 31 and the first and second semiconductor layers 34 and 44. The nano-gap 43 is surrounded and formed by the protection layer 60 and the first electrode 41, the second electrode 42 is disposed on the protection layer 60, and the insulating layer 70 is disposed between the gate 31 and the second semiconductor layer 44.

Figure 7A:
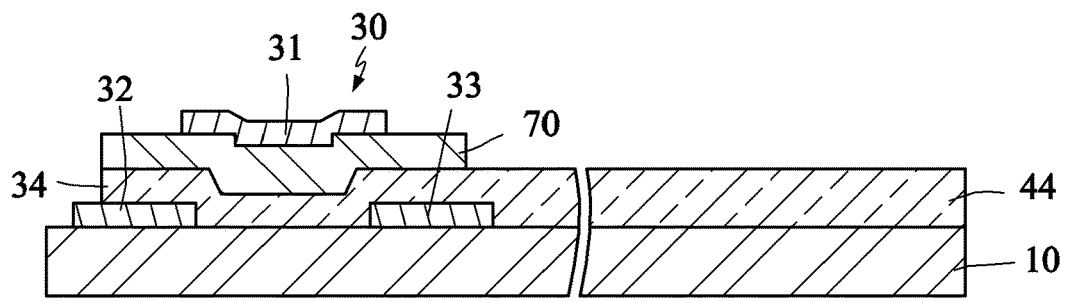
FIGS. 7A to 7G show schematically cross-sectional views of structures in steps of the manufacturing method of the pseudo-piezoelectric d33 vibration device of FIG. 7.

FIGS. 7A to 7G show schematically cross-sectional views of structures in steps of the manufacturing method of the pseudo-piezoelectric d33 vibration device of FIG. 7. The manufacturing method is also similar to FIGS. 6A to 6G. In FIG. 7A, a portion of the transistor 30 is firstly formed on the left side of the substrate 10, the partial material for the formation of the transistor 30 is reserved on the right side, such as insulating layer 70 (oxide or nitride), and the second and first semiconductor layers 44 and 34. At this time, the second and first semiconductor layers 44 and 34 pertain to the same layer, such as the amorphous silicon, polysilicon layer or germanium (Ge) layer, which is an important material layer of the transistor 30.

Figure 7B:
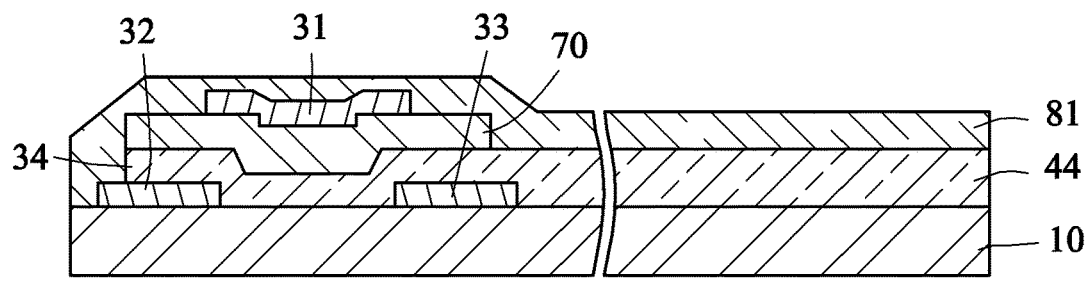
Figure 7C:
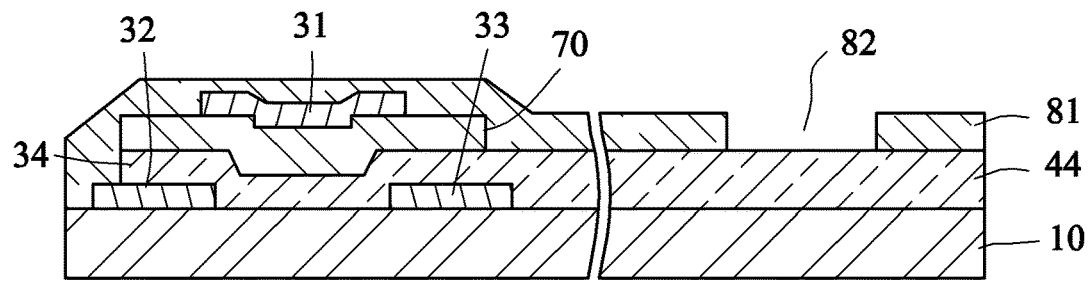
Figure 7D:
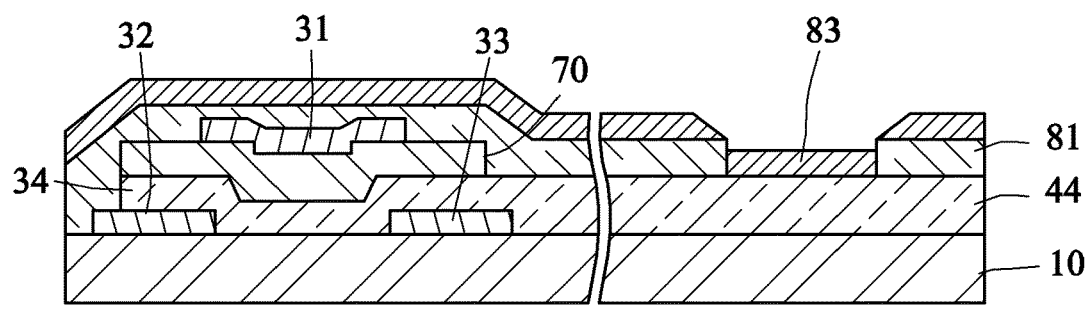
Figure 7E:
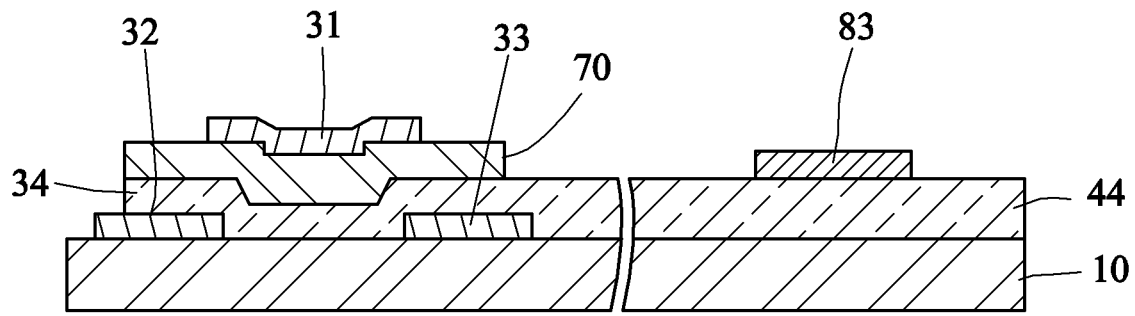
Figure 7F:
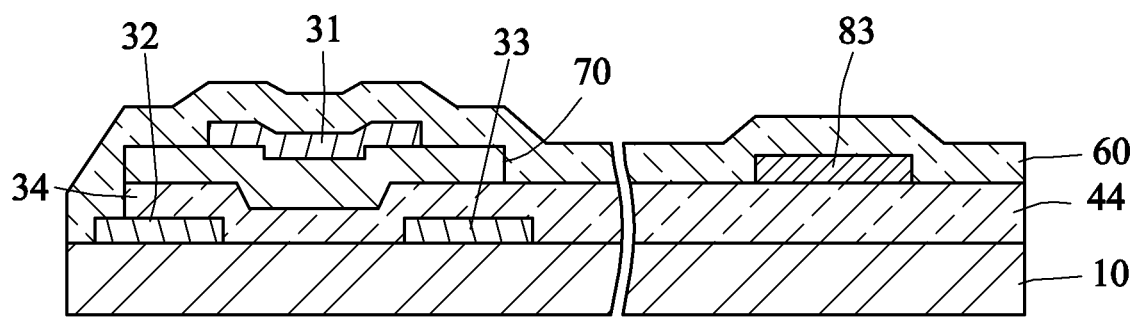
Figure 7G:
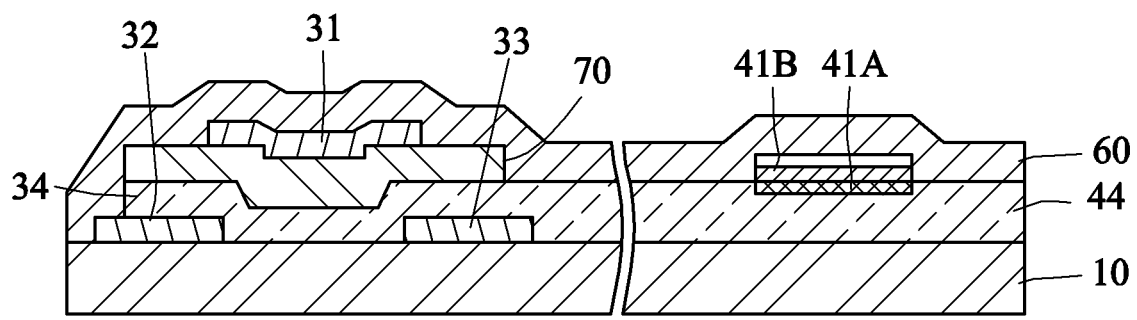

Next, in FIG. 7B, a resist layer 81 covers the second semiconductor layer 44, the insulating layer 70 and the gate 31. Next, in FIG. 7C, the resist layer 81 is patterned to form an opening 82. Then, in FIG. 7D, a metal layer 83 made of, for example, nickel (Ni), titanium (Ti), tungsten (W) or the like is formed on the top surface of the overall structure of FIG. 7C. The metal layer 83 is filled into the opening 82 and also covers the resist layer 81. Next, in FIG. 7E, the resist layer 81 is removed, and a portion of the metal layer 83 is reserved. Then, in FIG. 7F, the protection layer 60 is formed on the second semiconductor layer 44, the first semiconductor layer 34, the insulating layer 70, the gate 31 and the metal layer 83. Next, in FIG. 7G, the overall structure of FIG. 7F is moved to the oven at the temperature of about or above 250° C., so that the metal layer 83 and the second semiconductor layer 44 thermally react to generate the metal silicide layer 41A. Meanwhile, a portion of the metal layer 83 is reserved as the metal layer 41B. Then, In FIG. 7, the second electrode 42, made of the material, such as ITO conductor, aluminum or the like, is formed on the protection layer 60, so that the integration with the display becomes possible. It is worth noting that the second electrode 42 may be firstly formed on the structure of FIG. 7F, and then the thermal chemical reaction is conducted without affecting the effect of this embodiment. That is, deciding the forming sequence of the metal silicide according to the manufacturing process requirement is flexible without affecting the result of this disclosure.

Figure 8:
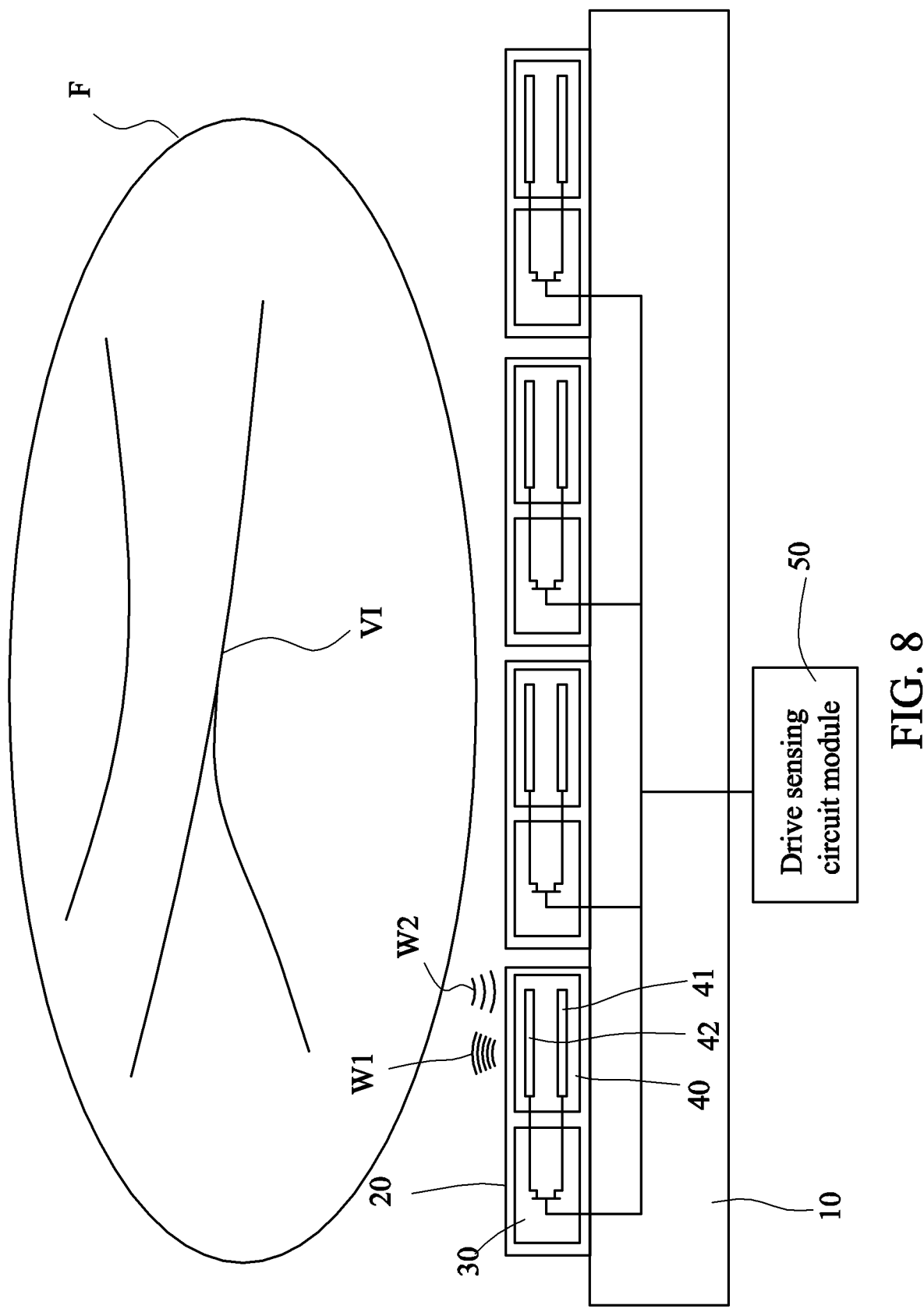
FIG. 8 shows a schematic view of another application of the pseudo-piezoelectric d33 vibration device according to the preferred embodiment of this disclosure.

FIG. 8 shows a schematic view of another application of the vibration device 100 according to the preferred embodiment of this disclosure. In FIG. 8, the vibration device 100 may also be used to sense the image or blood flow information of the vein VI of the finger F by way of time of fly (TOF) sensing to combine with the implementation of fingerprint sensing of FIG. 4. This disclosure may further combine both methods together to use the same device to sense the fingerprint and finger vein concurrently, or even measure the blood flow rate and the heartbeat.

Figure 9:
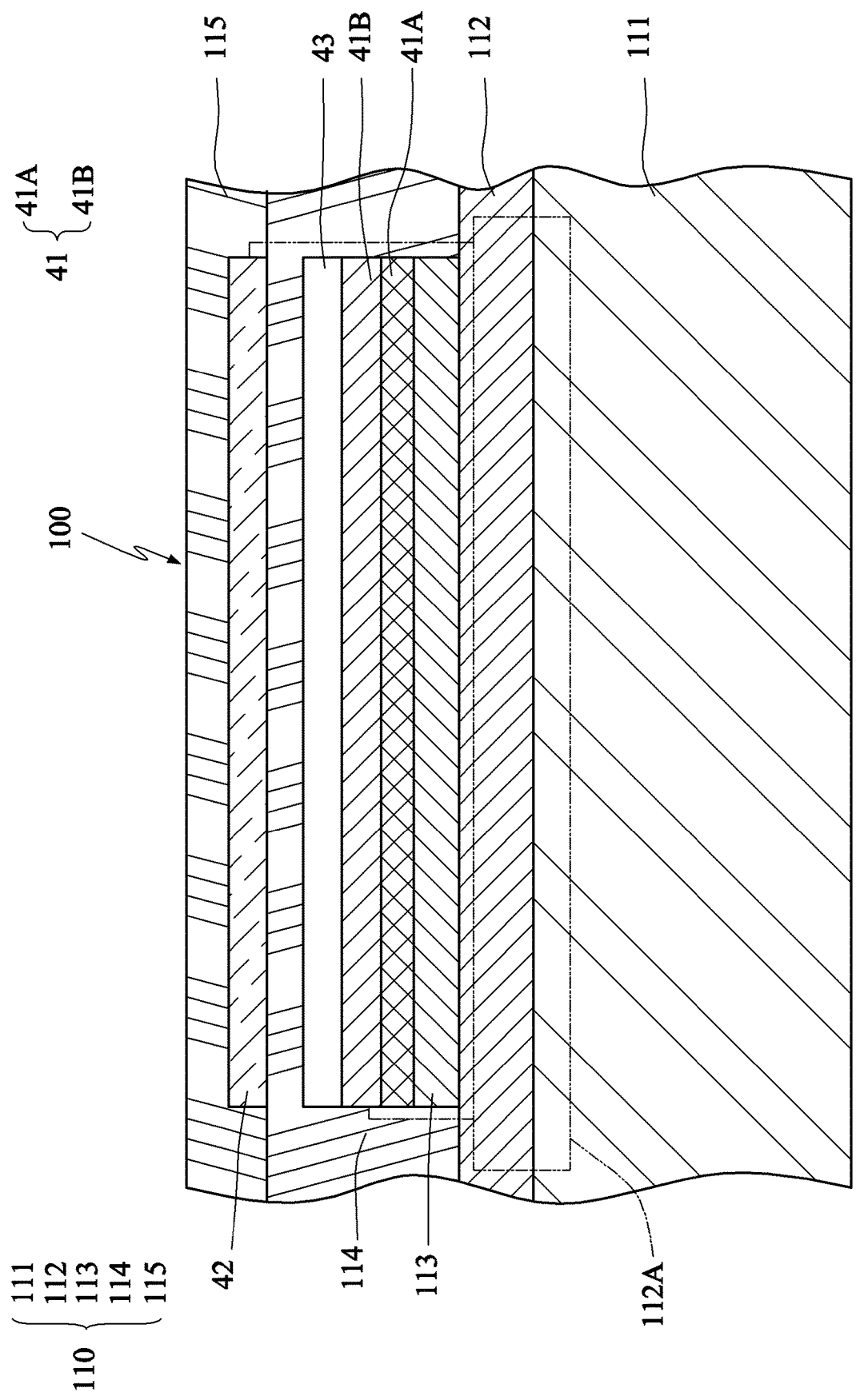
FIG. 9 shows a schematic view, wherein the pseudo-piezoelectric d33 vibration device of this disclosure is integrated with a CMOS back-end manufacturing process.

FIG. 9 shows a schematic view, wherein the pseudo-piezoelectric d33 vibration device of this disclosure is integrated with a CMOS back-end manufacturing process. That is, the transistor and circuit in the front-end manufacturing process are firstly manufactured, and then the back-end transceiver unit is manufactured. FIG. 9 only shows one portion of the vibration device 100 (i.e., only the portion of the transceiver unit), and the portion of the transistor is omitted. The vibration device 100 of this embodiment includes a body 110, a first electrode 41, a second electrode 42 and a nano-gap 43.

The first electrode 41 is disposed in the body 110. The second electrode 42 disposed in the body 110 corresponds to the first electrode 41. At least one of the first and second electrodes 41 and 42 includes a compound formed by a metal material reacting with a semiconductor material. The nano-gap 43 formed in the body 110 is disposed between the first and second electrodes 41 and 42. Because the nano-gap 43 is formed by the metal material and the semiconductor material through one or multiple thermal reactions to have the nanometer scale, it is named as the nano-gap. The detailed manufacturing method and advantage have been mentioned hereinabove.

The body 110 includes a substrate 111 (equivalent to the substrate 10 of FIG. 5), a first insulating layer 112 (equivalent to the insulating layer 70 of FIG. 5, or referred to as a dielectric layer set composed of metal interconnection layers and dielectric layers disposed between the metal interconnection layers), a semiconductor material layer 113 (equivalent to the second semiconductor layer 44 of FIG. 5), a second insulating layer 114 and a protection layer 115 (elements 114 and 115 are equivalent to the protection layer 60 of FIG. 5). The semiconductor material layer 113 includes the semiconductor material.

The first insulating layer 112 is disposed on the substrate 111. The semiconductor material layer 113 is disposed on the first insulating layer 112. The first electrode 41 is disposed on the semiconductor material layer 113. The second insulating layer 114 and the first electrode 41 commonly define the nano-gap 43. The second electrode 42 is disposed on the second insulating layer 114. The protection layer 115 covers the second insulating layer 114 and the second electrode 42.

The first electrode 41 includes a metal silicide layer 41A and a metal layer 41B. The metal layer 41B may include the metal material. The metal silicide layer 41A is disposed on the semiconductor material layer 113. The metal layer 41B neighbors upon the nano-gap 43, and is disposed on the metal silicide layer 41A. The metal layer 41B and the semiconductor material layer 113 form the metal silicide layer 41A after the thermal reaction.

In this embodiment, the first electrode 41 includes a metal conductor, such as nickel (Ni), titanium (Ti), tungsten (W) or the like. The material of the second electrode 42 may be the same as the metal conductor, low-resistance semiconductor, or polymeric conductor of the first electrode or the like. The semiconductor material layer 113 is the polysilicon or amorphous silicon layer, and may also be another semiconductor material layer, such as germanium (Ge) layer.

The first insulating layer 112 is disposed on the substrate 111. It is worth noting that the first insulating layer 112 may have the multi-layer structure, and may be the conductor layer (e.g., metal layer) formed in the back-end manufacturing process, the dielectric layer between the conductor layers and the via conductor between the conductor layers in the typical IC structure. Because the technology pertains to the prior art, detailed descriptions thereof will be omitted. Of course, the first insulating layer 112 may further include dielectric layers and traces composed of metal interconnection layers to form one set of integrated circuits 112A having a specific function in conjunction with active and passive circuit elements in the silicon substrate 111. Thus, the embodiment of this disclosure may further include one set of integrated circuits 112A, which is disposed on the bottom or lateral side of the vibration device and electrically connected to the first and second electrodes 41 and 42 for signal processing.

The semiconductor material layer 113 is disposed on the first insulating layer 112. The metal silicide layer 41A is formed in the semiconductor material layer 113. The metal layer 41B is disposed on the semiconductor material layer 113, and is connected and corresponds to the metal silicide layer 41A. With the photolithography method, the semiconductor material layer 113, the metal layer 41B and the metal silicide layer 41A only occupy a partial area of the first insulating layer 112, so the second insulating layer 114 may also be disposed on a portion of the first insulating layer 112. Therefore, a nano-gap 43 is thus formed through the sealing of the circumferential, top and bottom surfaces. The formation characteristic of the gap will be described later. Meanwhile, it is worth noting that the metal layer 41B originally occupies the complete volume of the nano-gap 43, and reacts with the bottom semiconductor material layer 113 at the high temperature to form the compound to consume the partial volume and form the nano-gap 43.

The nano-gap 43 is disposed between the second insulating layer 114 and the metal layer 41B, wherein the second insulating layer 114 may be interposed or not interposed in the middle. The second electrode 42 disposed on the second insulating layer 114 corresponds to the nano-gap 43 and the metal layer 41B. The protection layer 115 is disposed on the second electrode 42 and the second insulating layer 114. The surface of the protection layer 115 may be touched by the object. The protection layer 115 may have a multi-layer insulating layer structure, and an electroconductive material may further be added thereon due to the system's design requirement (e.g., electrostatic discharge protection requirement). Thus, the top-most surface of the protection layer 115 can be touched by the object capable of inputting multiple messages. Of course, if the second electrode 42 is not affected by the environment interference (e.g., no exposure to corrosion), then the protection layer 115 of this embodiment may also be unnecessary. Therefore, the transceiver unit further has: a dielectric layer set 112 disposed between the substrate 111 and the first electrode 41, wherein the substrate 111 and the dielectric layer set 112 commonly form an integrated circuit 112A electrically connected to the first and second electrodes 41 and 42; the second insulating layer 114 disposed between the nano-gap 43 and the second electrode 42; and the protection layer 115 covering the second electrode 42. It is worth noting that the protection layer 115 is optional, and may also be omitted.

In the embodiment, the glass or flexible substrate having the cost much lower than the semiconductor substrate can be adopted, and can be easily integrated with the manufacturing process of the mobile phone display. The vibration device 100 can sense the biometrics information such as gesture, fingerprint, finger vein or the like, or non-biometrics information (industrial applications). For the fingerprint sensor, the integrated transceivers 20 are arranged in a two-dimensional array, with a pitch ranging from 50 to 70 microns. The vibration device 100 may be an independent device, and may also be integrated with the display to become one portion of the display.

Figure 9A:
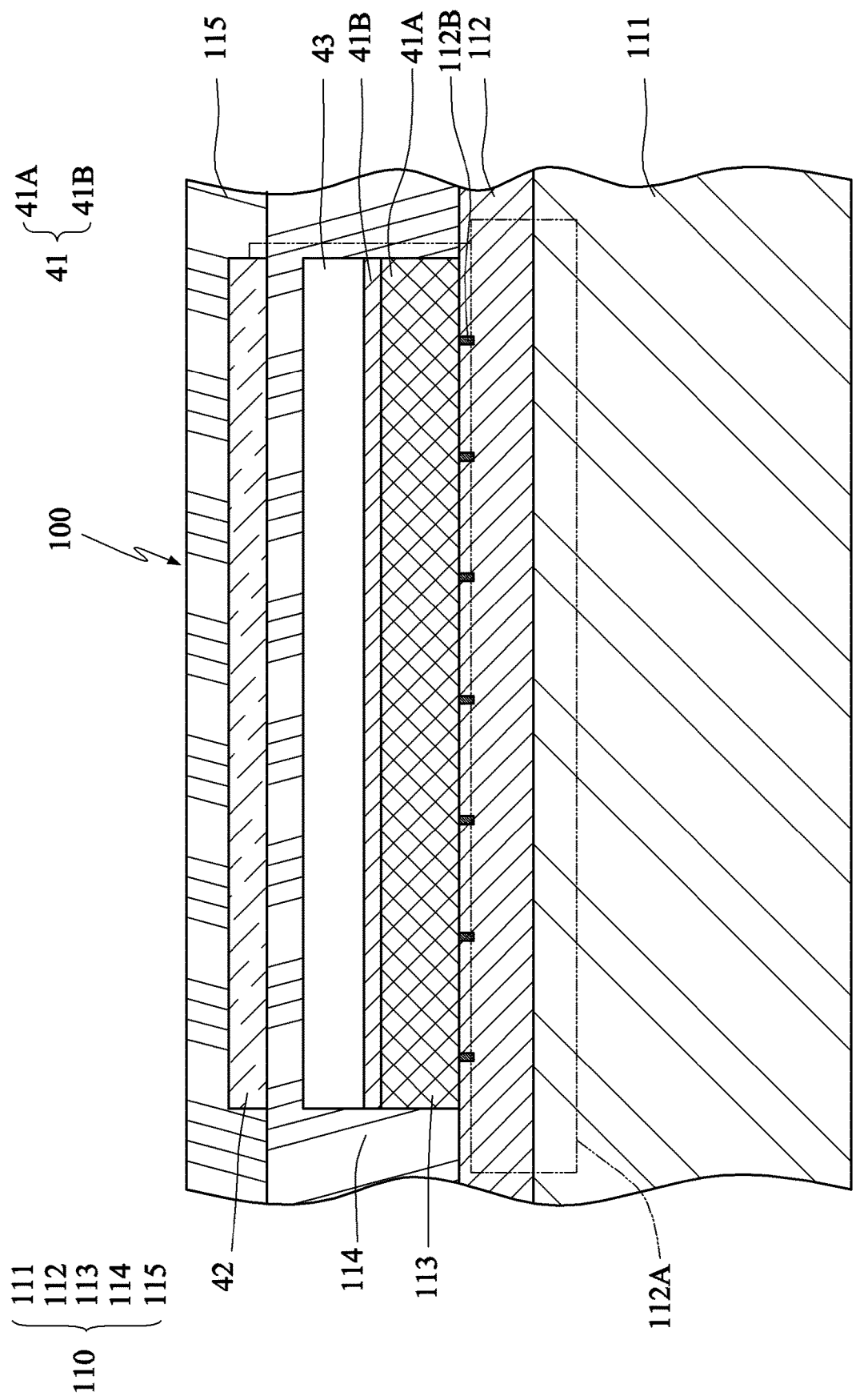
FIGS. 9A to 9C show schematic views of modified examples of FIG. 9.
Figure 9B:
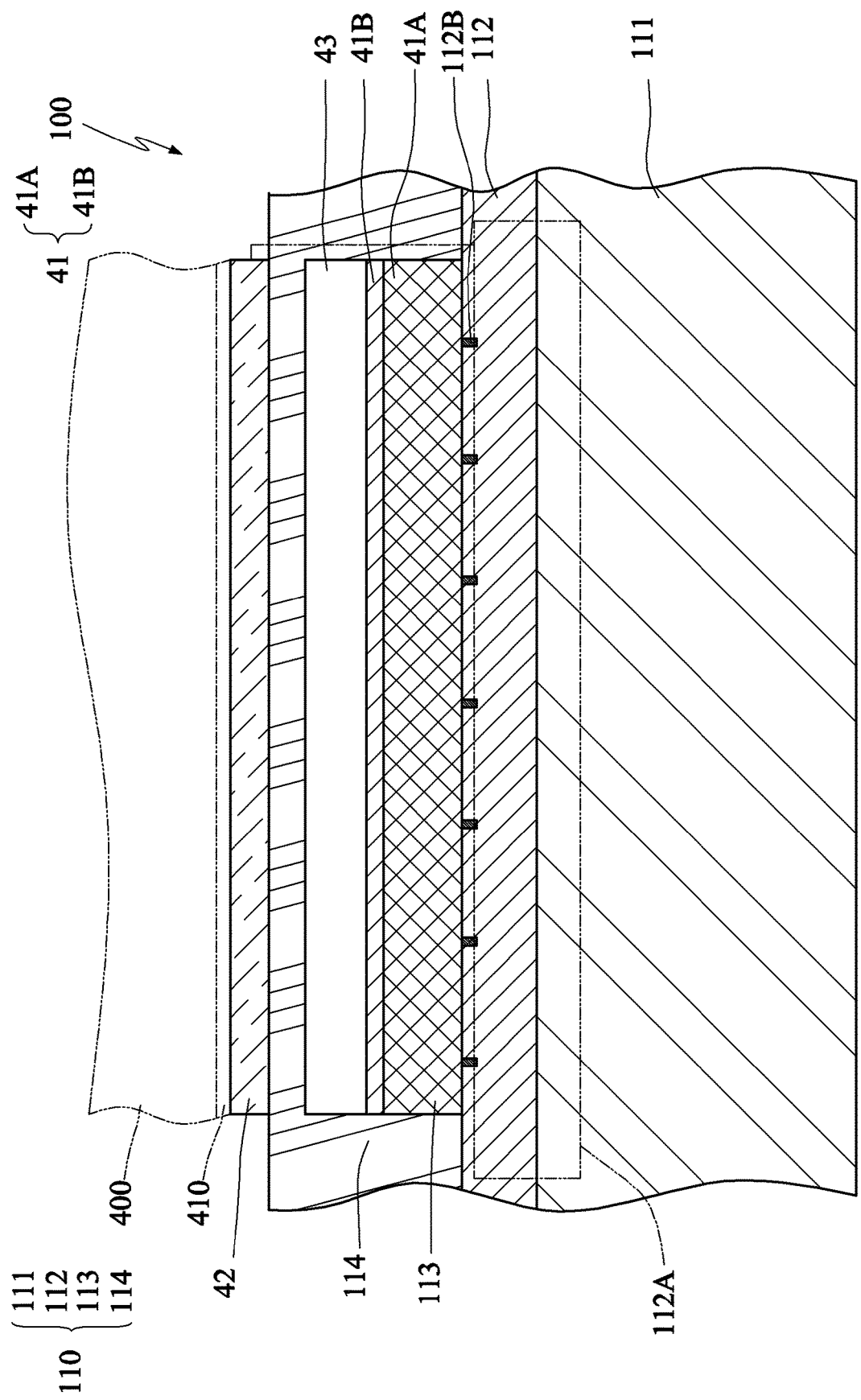
Figure 9C:
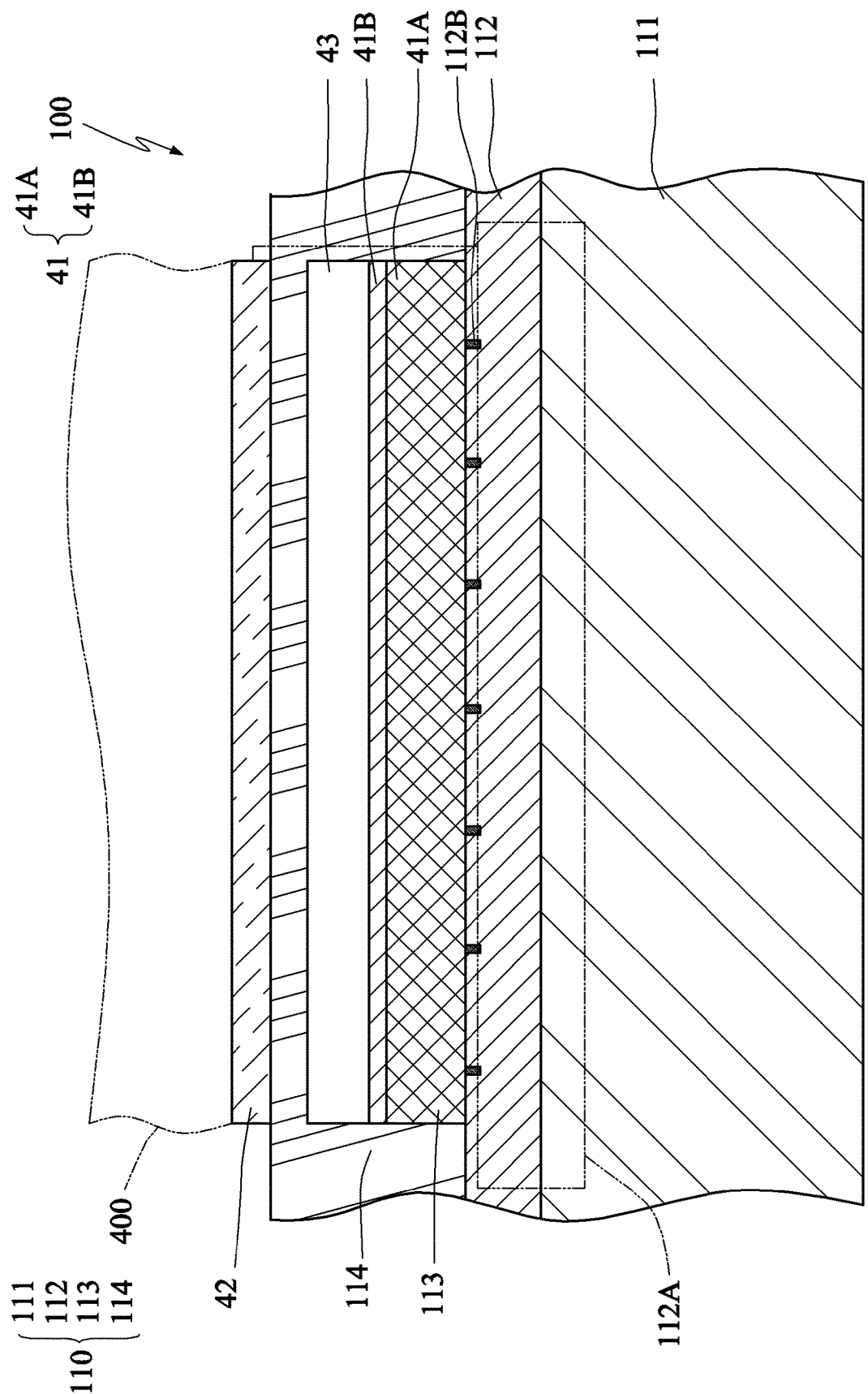

FIGS. 9A to 9C show schematic views of modified examples of FIG. 9. In FIG. 9A, the modified example is similar to FIG. 9 except for the difference that the dielectric layer set 112 has metal plugs 112B, such as copper or tungsten plugs (without limitation), which are disposed between the first electrode 41 and the integrated circuit 112A and electrically connect the first electrode 41 to the integrated circuit 112A. The integrated circuit 112A has the at least one transistor disposed on or in the substrate 111 and electrically connected to the transceiver unit. The substrate 111 is a silicon substrate used by CMOS elements. Of course, this disclosure is not restricted to silicon semiconductor substrates or CMOS elements. It is worth noting that the dielectric layer set 112 and the metal interconnection layer may also achieve the electrical connection function through other metal plugs (not shown). In FIG. 9B, this embodiment is similar to FIG. 9A except for the formation method of the second electrode 42. In FIG. 9B, after the second insulating layer 114 is formed, a planarization process, such as chemical mechanical polishing (CMP), is performed on the second insulating layer 114, and then an insulating layer 410 is formed on a prepared silicon wafer (monocrystalline silicon) 400. Then, a polysilicon layer (42) is formed on the insulating layer 410, and the polysilicon layer (42) is bonded to the second insulating layer 114. In one example, the second insulating layer 114 is a silicon oxide layer, which is formed after CMP and functions as a fusion bonding interface layer. The second insulating layer 114 and another monocrystalline silicon wafer form an interface with the hydrogen bond strength through low-temperature fusion bonding (LTFB). Of course, before LTFB, in order to achieve the surface activation, the surface plasma treatment can further be performed (e.g., exposed to plasma environment of oxygen ($O_2$) and nitrogen ($N_2$)). In order to make the bonded surface have the good flatness, the to-be-bonded surface can be polished and planarized by CMP. Next, the silicon wafer 400 is thinned down, and the residual silicon wafer 400 is etched to expose the insulating layer 410. Next, the insulating layer 410 may be removed (the step is optional) to expose the polysilicon layer (42), and the polysilicon layer (42) is patterned to form the second electrode 42. Finally, the protection layer 115 (may also be the insulating layer 410) of FIG. 9A is formed. It is worth noting that the polysilicon layer (42) may also be replaced with another monocrystalline silicon wafer, the used manufacturing process is the known silicon on insulator (SOI) manufacturing process, and detailed descriptions thereof will be omitted.

In FIG. 9C, this embodiment is similar to FIG. 9A except for the formation method of the second electrode 42. In FIG. 9C, after the second insulating layer 114 is formed, the planarization process (e.g., CMP) is performed on the second insulating layer 114, and then the prepared silicon wafer (monocrystalline silicon) 400 is bonded to the second insulating layer 114 (similar to fusion bonding). Of course, the polymer bonding, another metal eutectic bonding or the like may be adopted. Next, the silicon wafer 400 is thinned down to form the second electrode 42. Finally, the protection layer 115 of FIG. 9A is formed.

Figure 10A:
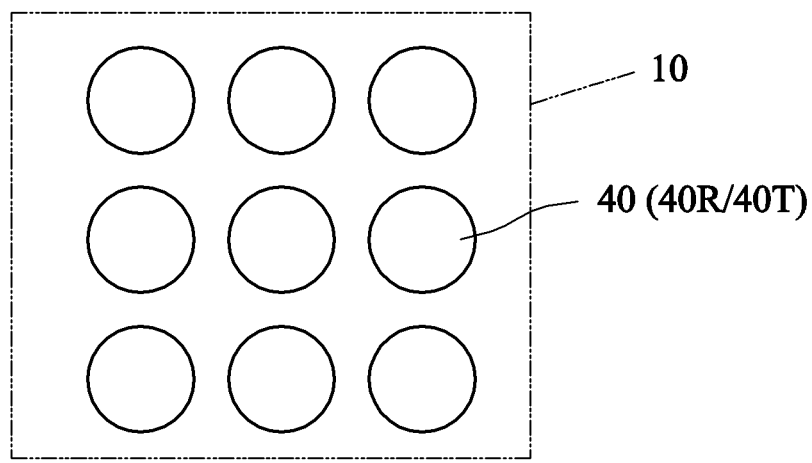
FIGS. 10A to 10D show schematic top views of four examples of layouts of receiver(s) and transmitter(s).
Figure 10B:
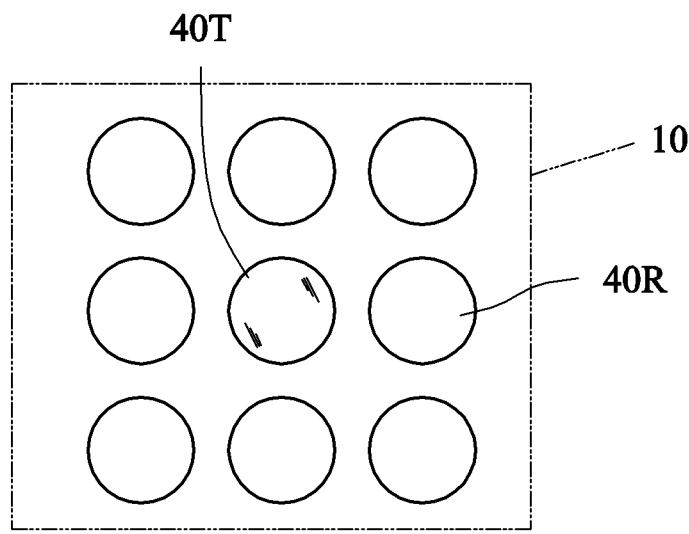
Figure 10C:
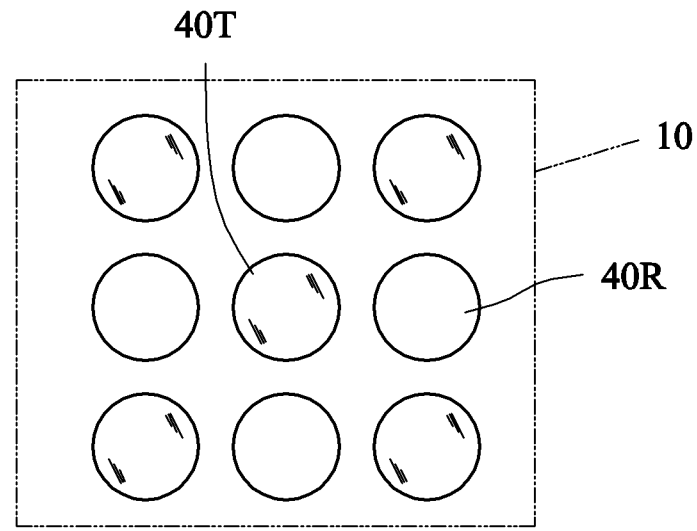
Figure 10D:
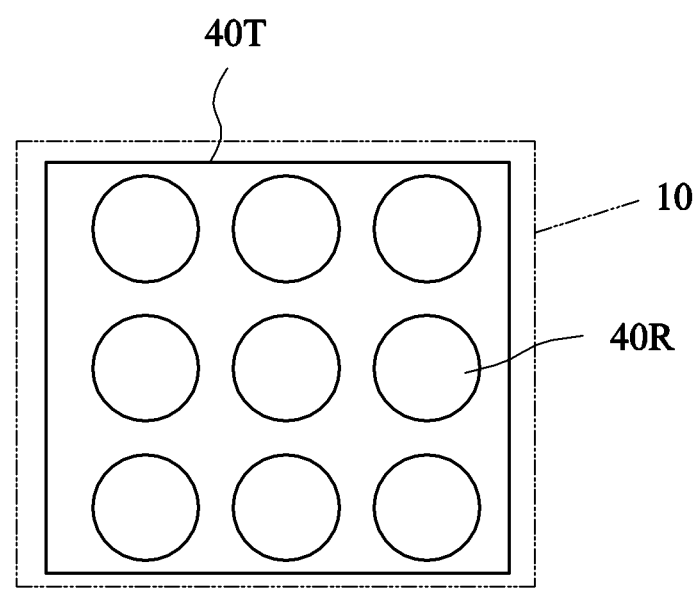

FIGS. 10A to 10D show schematic top views of four examples of layouts of receiver(s) and transmitter(s). In FIG. 10A, the transceiver units 40 disposed on the top surface of the substrate 10 function as the transmitters 40T and receivers 40R at different time instants, the transceiver units 40 are arranged in a two-dimensional array, the transistor (not shown) is arranged beside or under the transceiver unit 40. The arrangement is applicable to FIGS. 5 and 7. In FIG. 10B, one transmitter 40T and eight receivers 40R are disposed on the top surface of the substrate 10. After the transmitter 40T transmits the vibration wave, the receivers 40R receive the vibration wave. The arrangement is applicable to FIGS. 5 and 7. In FIG. 10C, the transmitters 40T and receivers 40R are alternately disposed on the top surface of the substrate 10. After the transmitters 40T transmit the vibration wave, the receivers 40R receive the vibration wave. The arrangement is applicable to FIGS. 5 and 7. In FIG. 10D, the receivers 40R are arranged in the two-dimensional array on the top surface of the substrate 10, and the transmitter 40T occupies the large area and can be disposed on the bottom surface of the substrate 10 or the portion of the display module above the substrate 10. After the transmitter 40T transmits the vibration wave, the receivers 40R receive the vibration wave. It is worth noting that FIGS. 10A to 10D are only designed for explanation of different embodiments without restricting the scope to such the geometric configuration. Any planning of the transmitter(s) 40T and receiver(s) 40R having any geometric dimensions and numbers cannot escape from the spirit of this disclosure.

Figure 11:
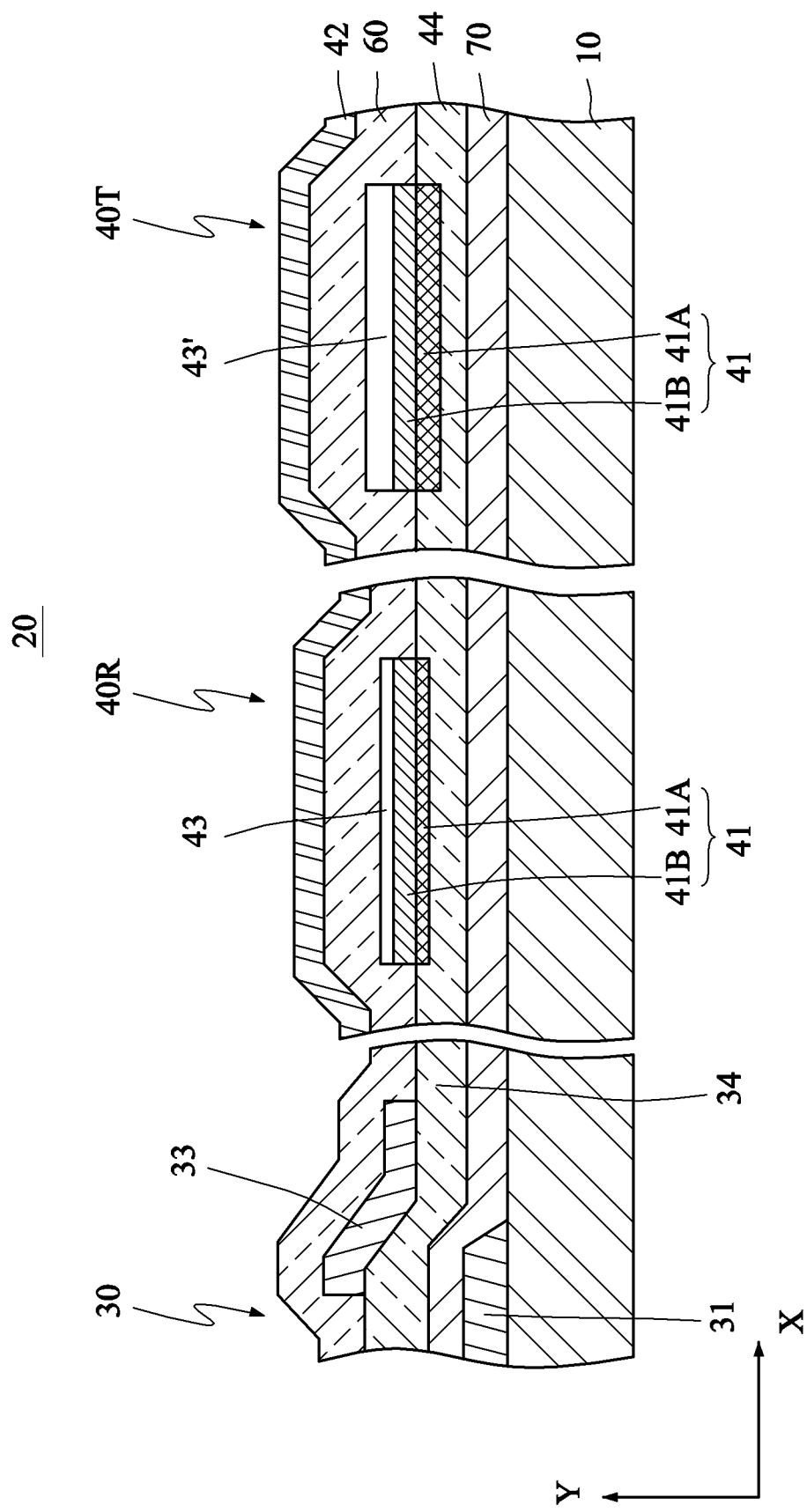
FIG. 11 shows a schematically partial cross-sectional view of the integrated transceiver having two different heights of nano-gaps.

FIG. 11 shows a schematically partial cross-sectional view of the integrated transceiver having two different heights of nano-gaps. In FIG. 11, this embodiment is applicable to the examples of FIGS. 10B and 10C, and similar to the embodiment of FIG. 7. In FIGS. 4 and 11, the vibration device 100 further includes a transmitter 40T electrically connected to the transistors 30. The transistors 30 control the transmitter 40T to transmit the first vibration wave W1 at a first time instant, and then control the receivers 40R to receive the second vibration wave W2 at a second time instant. In addition, the transmitter 40T has the first electrode 41, the second electrode 42 and a second nano-gap 43', which is created between the first and second electrodes 41 and 42 and is formed after the semiconductor-metal compound (or another semiconductor-metal compound) is formed. The transmitter 40T and the receiver 40R are disposed on the substrate 10. Each transistor 30 is disposed on or in the substrate 10. The height of the second nano-gap 43' is greater than the height of each nano-gap 43. Regarding the sensitivity of the receiver 40R, the nano-gap 43 is preferably small. For example, when the nano-gap 43 is very small, the amplitude of the second electrode 42 can easily reach one tenth of the nano-gap 43, so that a voltage of 3.3 V reflects the signal of 330 mV. The reflected signal is very high in the IC design. Regarding the signal intensity of the transmitter 40T, the second nano-gap 43' is preferably larger (the gap height is optimized according to the use specification). Therefore, the performance of the vibration device is enhanced by designing the second nano-gap 43' to be greater than the nano-gap 43. The second nano-gap 43' can be increased by only increasing the thickness of the corresponding metal layer 41B (e.g., the metal layer 83 of FIG. 6F) or the thickness of the polysilicon or amorphous silicon layer of the second semiconductor layer 44.

Figure 12:
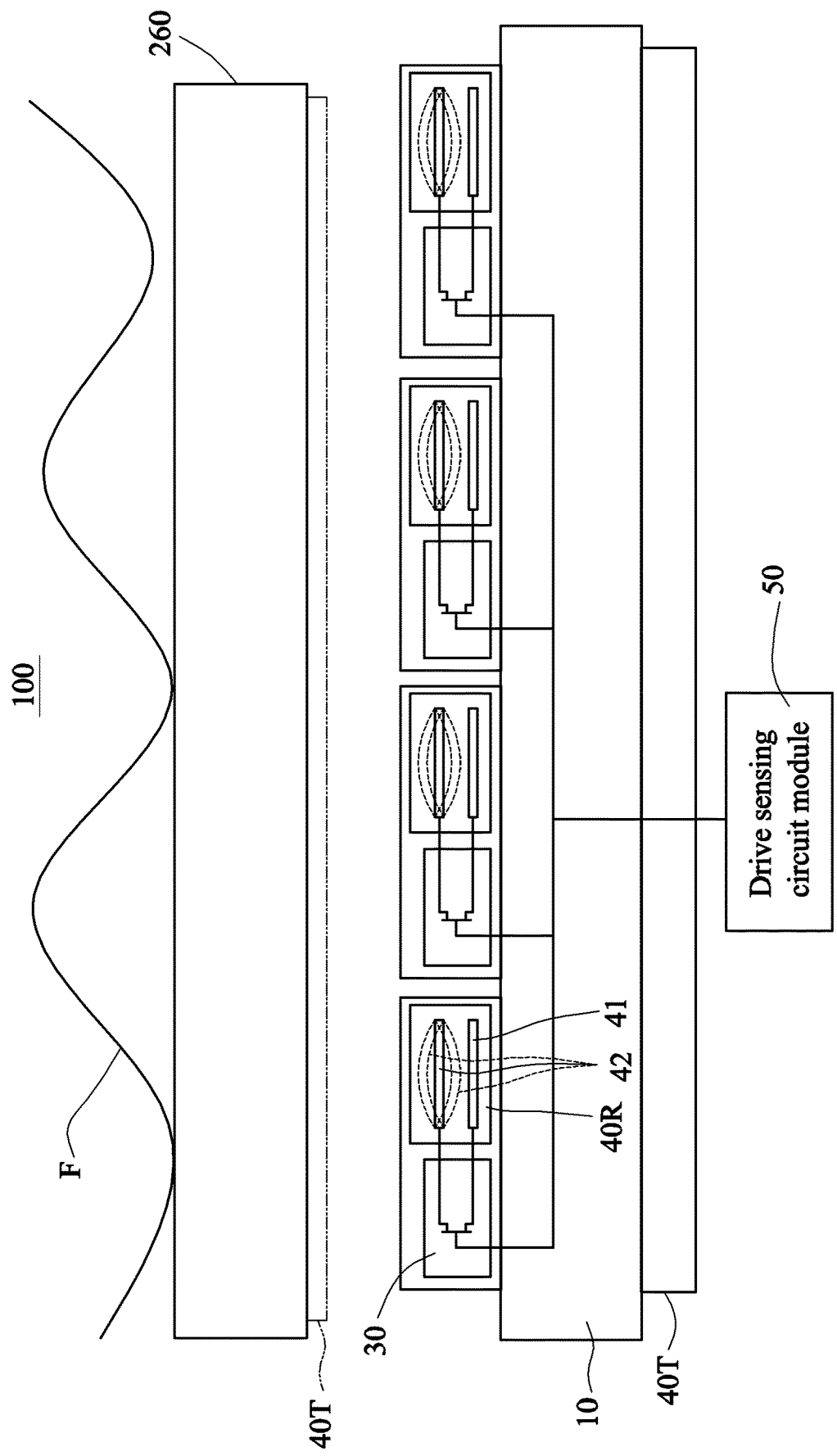
FIG. 12 shows a schematic configuration view of transmitters corresponding to FIG. 10D.

FIG. 12 shows a schematic configuration view of transmitters corresponding to FIG. 10D. FIG. 12 is similar to FIG. 4, wherein the receivers 40R are disposed on an upper surface 10T of the substrate 10, and each transistor 30 is disposed on or in the substrate 10, except for the difference that the transmitter 40T is different from the receiver 40R. The transmitter 40T is a piezoelectric transmitter, disposed on a bottom surface 10B of the substrate 10 or above the receiver 40R (disposed on a bottom surface of a display 260 (may also be disposed on a top surface of the display 260, in the display 260 or at another proper position)), so that the signal sensing function can be achieved.

Figure 13A:
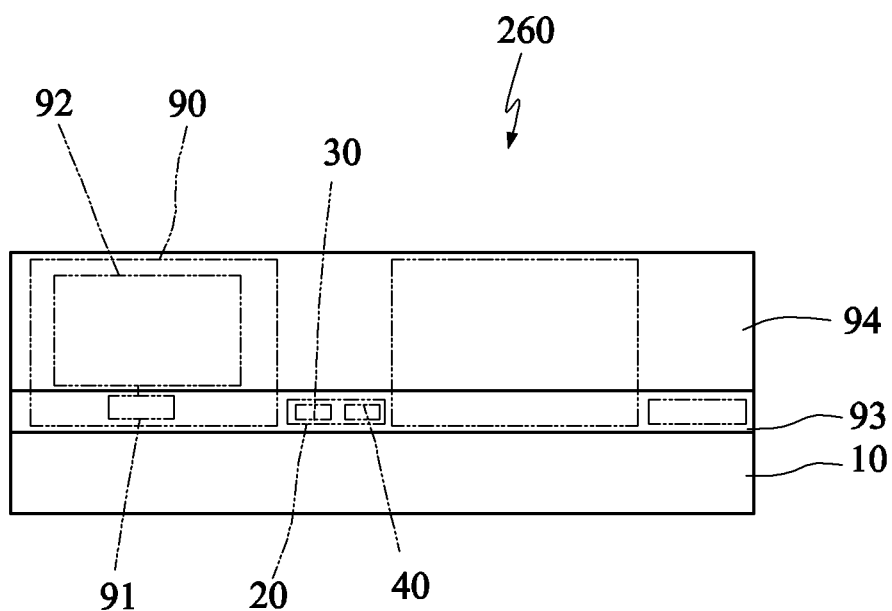
FIGS. 13A and 13B show schematic views of two examples of displays using the transceivers.
Figure 13B:
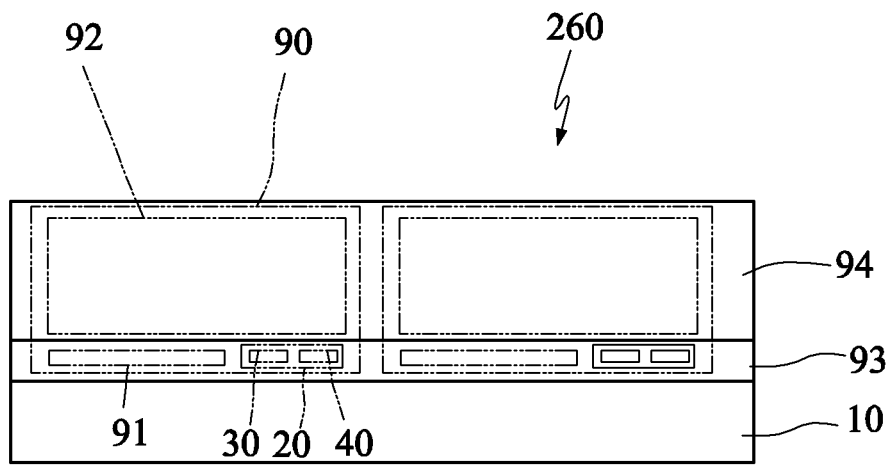

FIGS. 13A and 13B show schematic views of two examples of displays using the transceivers. In FIGS. 13A, 13B and 4, a display 260, such as the display 210 in FIG. 2A or 2B, includes a substrate 10, integrated transceivers 20 and display units 90. The substrate 10 is a rigid substrate (rigid glass plate OLED, LCD or the like), a flexible substrate (flexible board OLED) or a transparent substrate. The display 260 includes, for example but without limitation, the OLED, TFT-LCD, micro LED display or the like. The integrated transceivers 20 are disposed on the substrate 10. Each integrated transceiver 20 includes a transceiver unit 40 and at least one transistor 30 (defined as a transceiving control transistor in the claims) electrically connected together.

The transistor 30 controls transmitting and receiving of the transceiver unit 40 to enable the transceiver unit 40 to transmit a first vibration wave W1 to an object F, which reflects the first vibration wave W1 to generate a second vibration wave W2. The transceiver unit 40 receives the second vibration wave W2 to generate a sensing signal. Each display unit 90 disposed on the substrate 10 includes at least one display control transistor 91 and a display pixel 92 electrically connected together. The display control transistor 91 controls enabling of the display pixel 92 to display an optical signal and disabling of the display unit 92 not to display the optical signal so that data is displayed.

In terms of the layered layout, the display further includes a display pixel configuration layer 94, and a transistor configuration layer 93 disposed on the substrate 10. The transistor 30 and the transceiver unit 40 are disposed in the transistor configuration layer 93. The display pixel configuration layer 94 is disposed on the transistor configuration layer 93. The display pixel 92 is disposed in the display pixel configuration layer 94. Therefore, the transistor configuration layer 93 is formed with transistors for controlling the display pixel 92 and the transceiver unit 40. In addition, the display pixel configuration layer 94 is a light-emitting layer (e.g., in the OLED display) or an optical switch layer (e.g., in the LCD display). In another example, two electrode layers (anode and cathode layers, not shown) may be respectively disposed above and below the display pixel configuration layer 94, and at least one transparent layer (not shown) may be disposed above the display pixel configuration layer 94 to provide the display function. Of course, a touch layer may also be disposed to provide the touch function. Those skilled in the display art should understand that the embodiment of this disclosure aims at the creativity of the transceiver unit and the superiority obtained when being integrated with the manufacturing process of the display without aiming at teaching how to manufacture the display. So, the display is only described in brief. Instead, the target aims at how the device of this disclosure having the predetermined geometric configuration can be integrated with the display to complete the integrated display having the display function and the device of this disclosure.

FIG. 13A is similar to FIG. 13B except for the difference that the transceiver unit 40 in FIG. 13A is disposed outside the coverage range (rectangular range) of each display unit 90 (i.e., the areas of the transceiver unit and the display unit do not overlap), while in FIG. 13B, each transceiver unit 40 is disposed within the coverage range (rectangular range) of each display unit 90 (i.e., the areas of the transceiver unit and the display unit partially or entirely overlap). Thus, the transceiver can be integrated in the display to achieve the displaying and sensing functions concurrently.

Figure 14:
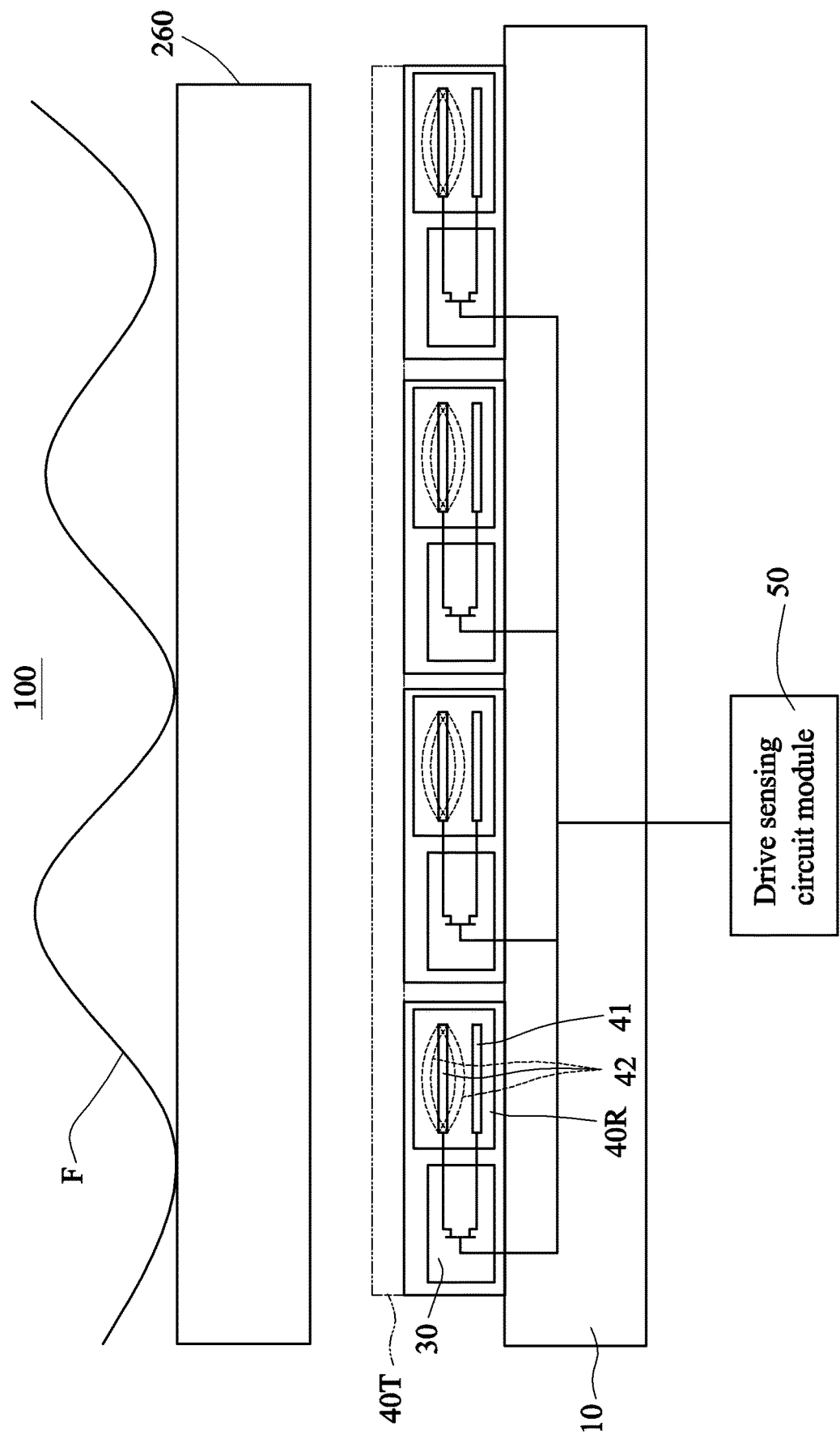
FIG. 14 shows another schematic configuration view of transmitters corresponding to FIG. 10D.
Figure 15:
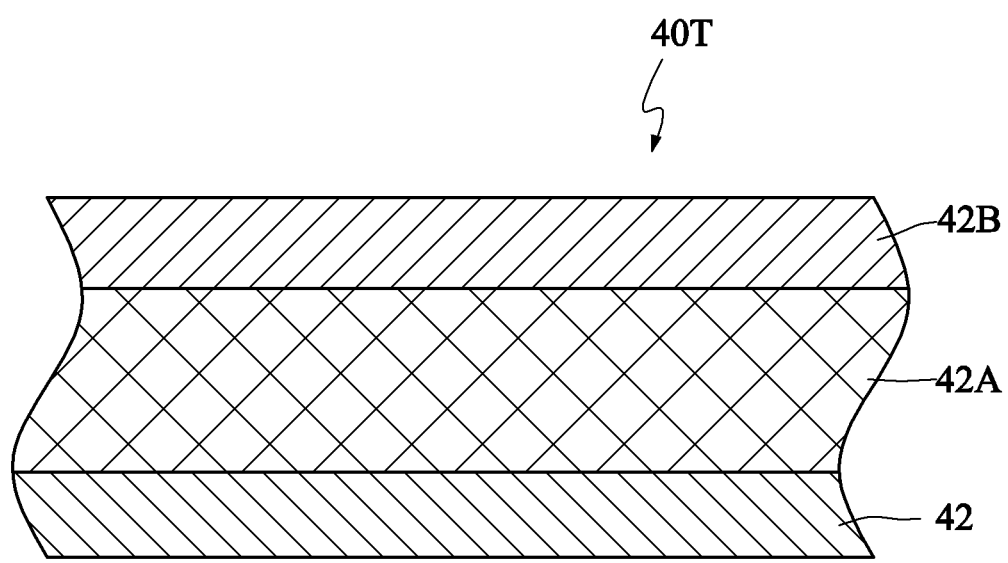
FIG. 15 shows a schematic view of the configuration working in conjunction with the piezoelectric transmitter of FIG. 5.

In FIG. 14, the transmitter 40T is a piezoelectric transmitter, the transmitter may have one single layer of piezoelectric structure, the transmitter may also have one or multiple independent transmitter units disposed on or above one or multiple receivers 40R. That is, the transmitter 40T is disposed on or above the one or multiple receivers 40R. When being implemented by one single transmitter unit, the transmitter 40T may also be disposed on or above the transistors 30. The piezoelectric transmitter includes the piezoelectric bulk material or piezoelectric membrane made of the material(s) including, for example but without limitation to, PVDF, PZT, zinc oxide, aluminum nitride and/or the like. In the application of FIG. 5, a protection layer or any other suitable structure may be formed on the second electrode 42 and the protection layer 60, and then a bottom electrode, a piezoelectric material and a top electrode are sequentially formed so that the piezoelectric transmitter can be used to transmit the vibration wave or signal. Alternatively, the second electrode 42 may also function as the bottom electrode of the piezoelectric transmitter, and then the piezoelectric material 42A and the top electrode 42B are sequentially formed thereon. That is, the transmitter and the one or multiple receivers may share the same second electrode 42 to perform transmitting and receiving, as shown in FIG. 15.

The pseudo-piezoelectric d33 vibration device of the embodiment has the following advantages: (a) the device has no material limitation, may use non-piezoelectric materials, and has the wide range of materials applicable to the substrate; (b) the integration with the standard manufacturing process becomes easy; (c) the large-area transceiver can be formed by the low-temperature manufacturing process; (d) the relatively low drive voltage can be used since the nano-gap is adopted; (e) the device can be formed without using the sacrificial layer, so all circumferential walls of the nano-gap have no through hole and no filling material; (f) the materials used in the manufacturing process cannot contaminate the semiconductor device; and (g) the transmitter and receiver may have different nano-gaps so that the signal amplitude transmitted from the transmitter and the sensitivity of the receiver are increased.

While this disclosure has been described by way of examples and in terms of preferred embodiments, it is to be understood that this disclosure is not limited thereto. To the contrary, it is intended to cover various modifications. Therefore, the scope of the appended claims should be accorded the broadest interpretation so as to encompass all such modifications.

What is claimed is:

1. A pseudo-piezoelectric d33 vibration device, comprising:
    transistors; and
    receivers electrically connected to the transistors, wherein each of the transistors controls a corresponding one of the receivers to receive a second vibration wave, generated after an object reflects a first vibration wave, and to generate a sensing signal, wherein each of the receivers has a first electrode, a second electrode and a nano-gap, which is created between the first electrode and the second electrode after a semiconductor-metal compound is formed.

2. The pseudo-piezoelectric d33 vibration device according to claim 1, wherein each of the receivers further functions as a transmitter to operate as a transceiver unit, and the transceiver unit and a corresponding one of the transistors constitute an integrated transceiver, wherein in each of the integrated transceivers, the transistor controls the transceiver unit to transmit the first vibration wave at a first time instant, and then controls the transceiver unit to receive the second vibration wave at a second time instant.

3. The pseudo-piezoelectric d33 vibration device according to claim 2, further comprising:
    a substrate, wherein each of the integrated transceivers is disposed on the substrate, each of the transistors is disposed on or in the substrate, and each of the transceiver units neighbors upon the transistor.

4. The pseudo-piezoelectric d33 vibration device according to claim 3, wherein the transistor has a gate, a drain, a source and a first semiconductor layer disposed among the gate, the drain and the source.

5. The pseudo-piezoelectric d33 vibration device according to claim 3, wherein the transceiver unit further has a second semiconductor layer disposed between the substrate and the first electrode.

6. The pseudo-piezoelectric d33 vibration device according to claim 3, wherein:
    the transistor has a gate, a drain, a source and a first semiconductor layer disposed among the gate, the drain and the source;
    the transceiver unit further has a second semiconductor layer disposed between the substrate and the first electrode; and
    the first semiconductor layer and the second semiconductor layer pertain to a same layer of material.

7. The pseudo-piezoelectric d33 vibration device according to claim 3, wherein:
    the transistor has a gate, a drain, a source and a first semiconductor layer disposed among the gate, the drain and the source;
    the transceiver unit further has a second semiconductor layer disposed between the substrate and the first electrode; and
    the first semiconductor layer and the second semiconductor layer pertain to different layers of materials.

8. The pseudo-piezoelectric d33 vibration device according to claim 3, wherein a height of the nano-gap is smaller than or equal to 200 nanometers.

9. The pseudo-piezoelectric d33 vibration device according to claim 3, further comprising a drive sensing circuit module, which is electrically connected to the integrated transceiver and provides a drive voltage, ranging from 3.3 to 12 volts, to the integrated transceiver.

10. The pseudo-piezoelectric d33 vibration device according to claim 3, wherein the semiconductor-metal compound is a metal silicide layer.

11. The pseudo-piezoelectric d33 vibration device according to claim 3, further comprising a protection layer, wherein the nano-gap is surrounded by the protection layer and the first electrode, and the second electrode is disposed on the protection layer.

12. The pseudo-piezoelectric d33 vibration device according to claim 3, wherein the substrate is a glass substrate; a flexible substrate; or a semiconductor substrate formed with an insulating layer.

13. The pseudo-piezoelectric d33 vibration device according to claim 3 being integrated in a display or combined with and under the display.

14. The pseudo-piezoelectric d33 vibration device according to claim 3, wherein:
    the transistor has a gate, a drain, a source and a first semiconductor layer disposed among the gate, the drain and the source;
    the transceiver unit further has a second semiconductor layer disposed between the substrate and the first electrode; and
    the pseudo-piezoelectric d33 vibration device comprises multiple ones of the integrated transceiver, and the first electrodes of the transceiver units are electrically connected together through the second semiconductor layers and the first semiconductor layers.

15. The pseudo-piezoelectric d33 vibration device according to claim 3, wherein the pseudo-piezoelectric d33 vibration device comprises multiple ones of the integrated transceiver, phase differences between the first vibration waves of the transceiver units are concurrently controlled, and energies of the first vibration waves are concentrated and sequentially scanned by way of beam forming to maximize the energy of each of the first vibration waves and increase sensitivity.

16. The pseudo-piezoelectric d33 vibration device according to claim 3 providing biometrics characteristic sensing, 3D touch and gesture detection functions concurrently.

17. The pseudo-piezoelectric d33 vibration device according to claim 3 being a variable frequency transceiver, which senses depth information of different characteristics of the object.

18. The pseudo-piezoelectric d33 vibration device according to claim 3, wherein all circumferential walls of the nano-gap have no through hole and no filling material.

19. The pseudo-piezoelectric d33 vibration device according to claim 3, wherein the nano-gap neighbors upon the semiconductor-metal compound through a metal layer of the first electrode, or directly neighbors upon the semiconductor-metal compound.

20. The pseudo-piezoelectric d33 vibration device according to claim 3, wherein the transceiver unit further has:
a dielectric layer set disposed between the substrate and the first electrode, wherein the substrate and the dielectric layer set commonly form an integrated circuit electrically connected to the first electrode and the second electrode; and
a second insulating layer disposed between the nano-gap and the second electrode.

21. The pseudo-piezoelectric d33 vibration device according to claim 20, wherein the dielectric layer set has metal plugs, which are disposed between the first electrode and the integrated circuit and electrically connect the first electrode to the integrated circuit.

22. The pseudo-piezoelectric d33 vibration device according to claim 3, wherein a material of the second electrode is monocrystalline silicon, polysilicon or amorphous silicon.

23. The pseudo-piezoelectric d33 vibration device according to claim 1, further comprising a transmitter electrically connected to the transistors, wherein the transistors control the transmitter to transmit the first vibration wave at a first time instant, and then control the receivers to receive the second vibration wave at a second time instant.

24. The pseudo-piezoelectric d33 vibration device according to claim 23, wherein the transmitter has a first electrode, a second electrode and a second nano-gap created between the first electrode of the transmitter and the second electrode of the transmitter after the semiconductor-metal compound or another semiconductor-metal compound is formed.

25. The pseudo-piezoelectric d33 vibration device according to claim 24, further comprising a substrate, wherein the transmitter and the receivers are disposed on the substrate, each of the transistors is disposed on or in the substrate, and a height of the second nano-gap is greater than a height of each of the nano-gaps.

26. The pseudo-piezoelectric d33 vibration device according to claim 23, further comprising a substrate, wherein the receivers are disposed on an upper surface of the substrate, each of the transistors is disposed on or in the substrate, and the transmitter is a piezoelectric transmitter disposed on a bottom surface of the substrate or above the receivers.

27. The pseudo-piezoelectric d33 vibration device according to claim 23, wherein the transmitter is a piezoelectric transmitter disposed on one or multiple ones of the receivers.

28. The pseudo-piezoelectric d33 vibration device according to claim 27, wherein the transmitter and the one or multiple ones of the receivers share the second electrode to perform transmitting and receiving.

29. A display, comprising:
transistors;
receivers electrically connected to the transistors, wherein each of the transistors controls a corresponding one of the receivers to receive a second vibration wave, generated after an object reflects a first vibration wave, and to generate a sensing signal, wherein each of the receivers has a first electrode, a second electrode and a nano-gap, which is created between the first electrode and the second electrode after a semiconductor-metal compound is formed; and
display units each comprising at least one display control transistor and a display pixel electrically connected together, wherein the display control transistor controls enabling of the display pixel to display an optical signal and disabling of the display pixel not to display the optical signal so that data is displayed.

30. The display according to claim 29, wherein each of the receivers further functions as a transmitter to operate as a transceiver unit, and the transceiver unit and a corresponding one of the transistors constitute an integrated transceiver, wherein in each of the integrated transceivers, the transistor controls the transceiver unit to transmit the first vibration wave at a first time instant, and then controls the transceiver unit to receive the second vibration wave at a second time instant.

31. The display according to claim 30, further comprising:
a substrate, wherein each of the integrated transceivers is disposed on the substrate, each of the integrated transceivers comprises the transceiver unit and at least one transceiving control transistor electrically connected together, and the transceiving control transistor controls transmitting and receiving of the transceiver unit.

32. The display according to claim 31, further comprising:
a transistor configuration layer disposed on the substrate, wherein the transceiving control transistor and the transceiver unit are disposed in the transistor configuration layer; and
a display pixel configuration layer disposed on the transistor configuration layer, wherein the display pixel is disposed in the display pixel configuration layer.

33. The display according to claim 31, wherein each of the transceiver units is disposed outside a coverage range of each of the display units.

34. The display according to claim 31, wherein each of the transceiver units is disposed within a coverage range of each of the display units.

35. The display according to claim 32, wherein the display pixel configuration layer is a light-emitting layer or an optical switch layer.

36. The display according to claim 31, wherein the substrate is a rigid substrate, a flexible substrate or a transparent substrate.

37. The display according to claim 31, wherein the nano-gap neighbors upon the semiconductor-metal compound through a metal layer of the first electrode, or directly neighbors upon the semiconductor-metal compound.

38. The display according to claim 37, wherein all circumferential walls of the nano-gap have no through hole and no filling material.

39. The display according to claim 29, further comprising a transmitter electrically connected to the transistors, wherein the transistors control the transmitter to transmit the first vibration wave at a first time instant, and then control the receivers to receive the second vibration wave at a second time instant.

40. The display according to claim 39, wherein the transmitter has a first electrode, a second electrode and a second nano-gap created between the first electrode of the transmitter and the second electrode of the transmitter after the semiconductor-metal compound or another semiconductor-metal compound is formed.

41. The display according to claim 40, further comprising a substrate, wherein the transmitter and the receivers are disposed on the substrate, each of the transistors is disposed on or in the substrate, and a height of the second nano-gap is greater than a height of each of the nano-gaps.

42. The display according to claim 39, further comprising a substrate, wherein the receivers are disposed on an upper surface of the substrate, each of the transistors is disposed on or in the substrate, and the transmitter is a piezoelectric transmitter disposed on a bottom surface of the substrate or above the receivers.

\* \* \* \* \*